(12) United States Patent
Thomas

(10) Patent No.: US 6,167,948 B1
(45) Date of Patent: *Jan. 2, 2001

(54) THIN, PLANAR HEAT SPREADER

(75) Inventor: Daniel Lee Thomas, Incline Village, NV (US)

(73) Assignee: Novel Concepts, Inc., San Francisco, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/751,585

(22) Filed: Nov. 18, 1996

(51) Int. Cl.$^7$ ..................................................... F28D 15/00
(52) U.S. Cl. ...................................... 165/104.26; 165/185
(58) Field of Search ......................... 165/104.26, 104.33, 165/104.21; 126/45, 96; 361/700; 257/715

(56) References Cited

U.S. PATENT DOCUMENTS

| Re. 33,567 | 4/1991 | Killip et al. ....................... 73/863.11 |
| 3,680,189 | 8/1972 | Noren ............................... 29/157.3 R |
| 3,700,028 | 10/1972 | Noren ..................................... 165/32 |

(List continued on next page.)

FOREIGN PATENT DOCUMENTS

| 0145890 | * 8/1983 | (JP) ................................. 165/104.26 |
| 1270507 | * 11 1986 | (SU) ................................ 165/104.26 |

OTHER PUBLICATIONS

Peterson, "An Introduction to Heat Pipes Modeling, Testing, and Applications", John Wiley & Sons, Inc., (1994) pp. 1–17, 159–326.

Primary Examiner—Christopher Atkinson
(74) Attorney, Agent, or Firm—William S. Galliani; Pennie & Edmonds LLP

(57) ABSTRACT

A heat spreading apparatus includes a first planar body for attachment to a heat generating surface which results in a hot region and a cool region on the first planar body. A second planar body connected to the first planar body is used to define a void between the first planar body and the second planar body. The void includes a planar capillary path and a non-capillary region. A fluid positioned within the void distributes heat by vaporizing the fluid from the planar capillary path in the hot region, condensing the fluid in the non-capillary region in the cool region, and moving from the non-capillary region to the planar capillary path in the hot region through capillarity.

34 Claims, 22 Drawing Sheets

U.S. PATENT DOCUMENTS

| | | | |
|---|---|---|---|
| 3,714,981 | 2/1973 | Noren | 165/47 |
| 3,962,869 | 6/1976 | Wössner | 60/298 |
| 3,997,381 | 12/1976 | Wanlass | 156/3 |
| 4,004,441 | 1/1977 | Leszak | 72/75 |
| 4,015,659 | 4/1977 | Schladitz | 165/105 |
| 4,019,098 | 4/1977 | McCready et al. | 361/385 |
| 4,020,898 | 5/1977 | Grover | 165/105 |
| 4,026,348 | 5/1977 | Roberts, Jr. | 165/32 |
| 4,042,757 | 8/1977 | Jones | 429/104 |
| 4,046,190 * | 9/1977 | Marcus et al. | 165/104.26 |
| 4,050,507 | 9/1977 | Chu et al. | 165/1 |
| 4,057,963 | 11/1977 | Basiulis | 60/641 |
| 4,058,159 | 11/1977 | Iriarte | 165/105 |
| 4,067,315 | 1/1978 | Fehlner et al. | 126/271 |
| 4,082,575 | 4/1978 | Eastman | 147/6.35 |
| 4,099,556 | 7/1978 | Roberts, Jr. | 165/96 |
| 4,107,922 | 8/1978 | Wössner | 60/298 |
| 4,118,756 | 10/1978 | Nelson et al. | 361/385 |
| 4,186,796 | 2/1980 | Usui | 165/105 |
| 4,194,559 | 3/1980 | Eastman | 165/105 |
| 4,196,504 | 4/1980 | Eastman | 29/157.3 R |
| 4,203,129 | 5/1980 | Oktay et al. | 357/82 |
| 4,212,347 | 7/1980 | Eastman | 165/46 |
| 4,219,078 | 8/1980 | Withers, Jr. | 165/133 |
| 4,220,195 | 9/1980 | Borgoyn et al. | 165/1 |
| 4,230,173 | 10/1980 | Eastman et al. | 165/1 |
| 4,248,295 | 2/1981 | Ernst et al. | 165/105 |
| 4,257,356 | 3/1981 | Minnick | 122/32 |
| 4,274,479 | 6/1981 | Eastman | 165/104.26 |
| 4,288,897 | 9/1981 | Withers, Jr. | 29/157.4 |
| 4,296,796 | 10/1981 | Wulf | 165/46 |
| 4,312,012 | 1/1982 | Frieser et al. | 357/82 |
| 4,315,498 | 2/1982 | Devin et al. | 126/422 |
| 4,322,737 | 3/1982 | Sliwa, Jr. | 357/82 |
| 4,345,642 | 8/1982 | Ernst et al. | 165/86 |
| 4,351,388 | 9/1982 | Calhoun et al. | 165/104.26 |
| 4,352,392 | 10/1982 | Eastman | 165/104.25 |
| 4,372,377 | 2/1983 | Morris | 165/104.26 |
| 4,381,818 | 5/1983 | Sachar et al. | 165/133 |
| 4,386,505 * | 6/1983 | Little | 165/185 R |
| 4,413,671 | 11/1983 | Basiulis | 165/1 |
| 4,434,842 | 3/1984 | Gregory | 165/133 |
| 4,438,807 | 3/1984 | Mathur et al. | 165/133 |
| 4,440,215 | 4/1984 | Grover et al. | 165/104.21 |
| 4,441,548 | 4/1984 | Franklin et al. | 165/104.26 |
| 4,457,059 | 7/1984 | Alario et al. | 29/157.3 H |
| 4,470,450 | 9/1984 | Bizzell et al. | 165/104.25 |
| 4,474,170 | 10/1984 | McConnell et al. | 126/433 |
| 4,478,275 | 10/1984 | Ernst | 165/133 |
| 4,485,670 | 12/1984 | Camarda et al. | 73/179 |
| 4,489,777 | 12/1984 | Del Bagno et al. | 165/104.26 |
| 4,492,266 | 1/1985 | Bizzell et al. | 165/104.26 |
| 4,516,631 | 5/1985 | Russell | 165/47 |
| 4,520,865 | 6/1985 | Bizzell | 165/104.26 |
| 4,523,636 | 6/1985 | Meijer et al. | 165/104.26 |
| 4,545,427 | 10/1985 | Alario et al. | 165/104.26 |
| 4,550,774 * | 11/1985 | Andres et al. | 165/104.21 |
| 4,565,243 | 1/1986 | Ernst et al. | 165/104.26 |
| 4,602,314 | 7/1986 | Broadbent | 361/386 |
| 4,617,093 | 10/1986 | Hwang | 203/100 |
| 4,632,179 | 12/1986 | Meijer et al. | 165/47 |
| 4,644,750 | 2/1987 | Lockett et al. | 60/641.2 |
| 4,671,348 | 6/1987 | Bauer | 165/41 |
| 4,681,995 | 7/1987 | Ahern et al. | 219/10.51 |
| 4,683,940 | 8/1987 | Ernst et al. | 165/32 |
| 4,685,512 | 8/1987 | Edelstein et al. | 165/104.14 |
| 4,693,124 | 9/1987 | Killip et al. | 73/863.11 |
| 4,696,010 | 9/1987 | Eastman | 372/34 |
| 4,697,205 | 9/1987 | Eastman | 357/82 |
| 4,706,740 | 11/1987 | Mahefkey | 165/104.14 |
| 4,712,609 | 12/1987 | Iversen | 165/80.4 |
| 4,765,396 | 8/1988 | Seidenberg | 165/104.26 |
| 4,785,875 | 11/1988 | Meijer et al. | 165/104.25 |
| 4,789,023 | 12/1988 | Grant | 165/1 |
| 4,789,026 | 12/1988 | Shank et al. | 165/104.26 |
| 4,794,984 | 1/1989 | Lin | 165/133 |
| 4,799,537 | 1/1989 | Hoke, Jr. | 165/32 |
| 4,807,697 | 2/1989 | Gernert et al. | 165/104.26 |
| 4,810,929 | 3/1989 | Strumbos | 313/11.5 |
| 4,815,528 | 3/1989 | Shaubach et al. | 165/104.26 |
| 4,824,496 | 4/1989 | Seifert et al. | 156/64 |
| 4,854,379 | 8/1989 | Shaubach et al. | 165/104.26 |
| 4,857,421 | 8/1989 | Ernst | 429/104 |
| 4,880,052 | 11/1989 | Meyer, IV et al. | 165/104.14 |
| 4,880,053 * | 11/1989 | Vladimir | 361/700 X |
| 4,883,116 | 11/1989 | Seidenberg et al. | 165/104.26 |
| 4,884,169 | 11/1989 | Cutchaw | 361/385 |
| 4,884,627 | 12/1989 | Abtahi | 165/104.26 |
| 4,898,231 | 2/1990 | Miyazaki | 165/13 |
| 4,899,810 | 2/1990 | Fredley | 165/41 |
| 4,917,173 | 4/1990 | Brown et al. | 165/13 |
| 4,917,177 | 4/1990 | Gernert | 165/104.26 |
| 4,941,527 | 7/1990 | Toth et al. | 165/47 |
| 4,972,812 | 11/1990 | Strumbos | 123/169 C |
| 4,989,070 | 1/1991 | Iversen et al. | 357/82 |
| 5,002,122 | 3/1991 | Sarraf et al. | 165/104.26 |
| 5,018,573 | 5/1991 | Zohler et al. | 165/133 |
| 5,036,905 | 8/1991 | Eninger et al. | 165/41 |
| 5,051,146 | 9/1991 | Kapolnek et al. | 156/345 |
| 5,076,352 | 12/1991 | Rosenfeld et al. | 165/104.26 |
| 5,127,471 | 7/1992 | Weislogel | 165/104.22 |
| 5,137,461 | 8/1992 | Bindra et al. | 439/74 |
| 5,168,921 | 12/1992 | Meyer, IV | 165/104.14 |
| 5,168,926 | 12/1992 | Watson et al. | 165/185 |
| 5,180,001 | 1/1993 | Okada et al. | 165/80.4 |
| 5,185,073 | 2/1993 | Bindra et al. | 205/104 |
| 5,187,030 | 2/1993 | Firmin et al. | 429/120 |
| 5,195,575 | 3/1993 | Wylie | 165/132 |
| 5,199,165 | 4/1993 | Crawford et al. | 29/846 |
| 5,200,248 | 4/1993 | Thompson et al. | 428/131 |
| 5,209,288 | 5/1993 | Brown et al. | 165/104.26 |
| 5,219,516 | 6/1993 | Horner-Richardson et al. | 376/321 |
| 5,231,756 | 8/1993 | Tokita et al. | 29/830 |
| 5,242,644 | 9/1993 | Thompson et al. | 264/177.15 |
| 5,267,611 | 12/1993 | Rosenfeld | 165/168 |
| 5,273,635 | 12/1993 | Gernert et al. | 204/241 |
| 5,283,464 | 2/1994 | Murase | 257/714 |
| 5,289,337 | 2/1994 | Aghazadeh et al. | 361/718 |
| 5,297,621 | 3/1994 | Taraci et al. | 165/104.13 |
| 5,298,685 | 3/1994 | Bindra et al. | 174/250 |
| 5,329,996 | 7/1994 | Rosenfeld | 165/168 |
| 5,335,720 | 8/1994 | Ogushi et al. | 165/104.26 |
| 5,339,214 | 8/1994 | Nelson | 361/695 |
| 5,349,823 | 9/1994 | Solomon | 62/6 |
| 5,351,397 | 10/1994 | Angeli | 29/890.053 |
| 5,360,058 | 11/1994 | Koeppl et al. | 165/104.26 |
| 5,375,041 | 12/1994 | McMahon | 361/749 |
| 5,386,143 | 1/1995 | Fitch | 257/715 |
| 5,388,958 | 2/1995 | Dinh | 415/90 |
| 5,394,936 | 3/1995 | Budelman | 165/104.33 |
| 5,397,746 | 3/1995 | Blish, II | 437/209 |
| 5,398,748 | 3/1995 | Yamaji et al. | 165/104.21 |
| 5,404,938 | 4/1995 | Dinh | 165/113 |
| 5,409,055 | 4/1995 | Tanaka et al. | 165/104.33 |
| 5,412,535 | 5/1995 | Chao et al. | 361/700 |
| 5,415,225 | 5/1995 | Randlett et al. | 165/133 |
| 5,427,174 | 6/1995 | Lomolino, Sr. et al. | 165/1 |
| 5,435,057 | 7/1995 | Bindra et al. | 29/830 |
| 5,439,351 | 8/1995 | Artt | 416/95 |
| 5,442,910 | 8/1995 | Anderson | 60/266 |
| 5,444,602 | 8/1995 | Banerjee et al. | 361/705 |

| | | | |
|---|---|---|---|
| 5,444,909 | 8/1995 | Mehr | 29/827 |
| 5,475,565 | 12/1995 | Bhattacharyya et al. | 361/719 |
| 5,489,801 | 2/1996 | Blish, II | 257/675 |
| 5,489,805 | 2/1996 | Hackitt et al. | 257/796 |
| 5,492,570 | 2/1996 | Horner-Richardson et al. | 136/200 |
| 5,497,938 | 3/1996 | McMahon et al. | 228/253 |
| 5,506,756 | 4/1996 | Haley | 361/789 |
| 5,507,092 | 4/1996 | Akachi | 29/890 |
| 5,513,070 | 4/1996 | Xie et al. | 361/700 |
| 5,522,452 | 6/1996 | Mizuno et al. | 165/40 |
| 5,530,295 | 6/1996 | Mehr | 257/796 |
| 5,535,094 | 7/1996 | Nelson et al. | 361/697 |
| 5,544,696 | 8/1996 | Leland | 165/80.4 |
| 5,549,155 | 8/1996 | Meyer, IV et al. | 165/104.33 |
| 5,552,960 | 9/1996 | Nelson et al. | 361/687 |
| 5,556,811 | 9/1996 | Agatstein et al. | 437/209 |
| 5,557,502 | 9/1996 | Banerjee et al. | 361/712 |
| 5,560,423 | 10/1996 | Larson et al. | 165/104.26 |
| 5,568,360 | 10/1996 | Penniman et al. | 361/687 |
| 5,725,049 * | 3/1998 | Swanson et al. | 165/104.26 |
| 5,769,154 * | 6/1998 | Adkins et al. | 126/96 X |

\* cited by examiner

THIN, PLANAR HEAT SPREADER

BRIEF DESCRIPTION OF THE INVENTION

This invention relates generally to a heat distribution device, such as for use with a microprocessor or other microelectronic device. More particularly, this invention relates to a thin, planar heat spreader that distributes heat through the use of a planar capillary fluid path.

BACKGROUND OF THE INVENTION

Semiconductors are continuously diminishing in size. Corresponding to this size reduction is an increase in the power densities of semiconductors. This, in turn, creates heat proliferation problems which must be resolved because excessive heat will degrade semiconductor performance.

Heat pipes and thermosiphons have been used to cool semiconductors. Both heat pipes and thermosiphons operate on a closed two-phase cycle that utilizes the latent heat of vaporization to transfer heat.

Thermosiphons are typically implemented as a tube which encloses a fluid. When used in relation to a semiconductor, for instance a microprocessor, the first end of the thermosiphon, called a vaporizer or evaporator, is attached to a heat generating surface of the semiconductor. The second end of the thermosiphon, referred to as a condenser, vertically extends from the semiconductor where it is cooled by ambient air.

In a first cycle, the heat from the semiconductor vaporizes the fluid within the thermosiphon. During this vaporization process, the fluid vapor absorbs a quantity of heat called the latent heat of vaporization. The vapor formed in the vaporizer is at a higher temperature and hence higher pressure than the vapor at the condenser. Thus, the vapor flows from the evaporator to the condenser.

In a second cycle, the vapor condenses on the condenser walls of the thermosiphon. The condensation operation results in the release of heat. As a result, heat is moved from the evaporator to the condenser. Gravitational forces then cause the condensate in the condenser to flow back to the evaporator. The two-cycle process is then repeated.

Although the inside surface of a thermosiphon may occasionally be lined with grooves or a porous structure to promote the return of the condensate to the evaporator or increase the heat transfer coefficient, thermosiphons principally rely upon local gravitational force to return liquid to the evaporator. By definition, then, for proper operation, the evaporator of a thermnosiphon must be located below the condenser.

Heat pipes operate on the same principle as thermosiphons. One distinguishing feature of heat pipes is that they utilize some sort of discrete wicking structure to promote the flow of liquid from the condenser to the evaporator. The wicking structure allows heat pipes to be used in a horizontal orientation relative to gravity, or even with the evaporator oriented against gravity, although the efficiency of the device varies greatly with different physical orientations. For example, if the device is oriented against gravity, its performance is reduced by approximately one-half. Thus, it is the dependence of the local gravitational field to promote the flow of the liquid from the condenser to the evaporator that differentiates thermosiphons from heat pipes.

The problem with using thermiosiphons with microprocessors is that thermosiphons require a vertical orientation with respect to gravity. This results in a high profile device. As a result, thermosiphons are difficult to use in compact electronic equipment such as palm, notebook, lap, desktop computers, and power supplies.

Another problem with the use of thermosiphons is that they are directionally sensitive. That is, they must be oriented such that gravity forces condensed fluid back to the evaporator. Microprocessor vendors do not know how a computer user will position a computer. For instance, some computers are placed horizontally on desk tops, while others are vertically mounted on floors. A theimosiphon can only operate with a single predetermined physical orientation to gravity.

While heat pipes are not as directionally sensitive, as thermosiphons, they still have the disadvantage of requiring a discrete wick structure. The discrete wick structure is typically formed of a screen, sintered metal, or as a set of axial grooves. A discrete wick structure adds manufacturing expense and otherwise mitigates against high volume manufacturing of heat pipes. In addition, a discrete wick structure, such as a screen, produces a relatively high hydrodynamic resistance. Thus, it would be highly desirable to provide a heat transfer device that is not directionally sensitive and does not require a high hydrodynamic resistance wick structure. Such a device should have a low vertical profile to insure that it can be readily incorporated into a variety of compact electronic equipment.

Another type of device that is commonly used to reduce the heat problems associated with semiconductors is a finned heat sink. A finned heat sink has a horizontal surface that is attached to a heat generating semiconductor surface and a set of fins vertically extending from the horizontal surface. The fins are cooled by ambient air. Thus, heat at the horizontal surface conductively migrates to the fins. Typically, heat is only generated in a few regions of the horizontal surface of a finned heat sink. Thus, only the fins corresponding to those few regions perform most of the cooling. To mitigate the problem of localized heat, a relatively thick heat slug can be used to improve heat distribution. The problem with this approach is that it substantially increases the vertical profile of the device. In addition, the heat slug is heavy and relatively expensive. Consequently, it would be highly desirable to provide a device that evenly distributes heat along the horizontal surface of a finned heat sink, without substantially increasing the vertical profile of the semiconductor package. Such a device would allow all of the fins of the heat sink to dissipate heat. Thus, the efficiency of the finned heat sink would be improved.

Fans have also been used to reduce the heat problems associated with heat generating surfaces, such as semiconductors. There is typically uneven heat distribution on the surface or surfaces from which a fan removes heat. A fan operating in these conditions is not as efficient as a fan removing heat from a surface with an even heat distribution. Moreover, when a fan is used on a heat generating surface, thermodynamic studies indicate that most air movement produced by the fan is applied at the perimeter of the fan. Thus, it is extremely important to convey heat to the perimeter of a heat generating surface. In view of the foregoing, it would be highly desirable to provide a device that evenly distributes heat to a surface or surfaces exposed to a fan. Optimally, such a device would have a low vertical profile to insure its compatibility with compact electronic equipment.

SUMMARY OF THE INVENTION

A heat spreading apparatus includes a first planar body for attachment to a heat generating surface resulting in a hot region and a cool region on the first planar body. A second planar body connected to the first planar body is used to define a void between the first planar body and the second planar body. The void includes a planar capillary path and a non-capillary region. A fluid positioned within the void distributes heat by vaporizing the fluid from the planar capillary path in the hot region, condensing the fluid in the non-capillary region in the cool region, and moving from the non-capillary region to the planar capillary path in the hot region through capillarity.

The body is extremely thin, typically less than 1.5 millimeters. Nevertheless, its heat distribution characteristics are much better than existing metal heat slurs with far larger vertical profiles. Thus, the device is ideally suited for compact electronic equipment and for use with other cooling, devices, such as finned heat sinks or fans.

While the device operates in a two-phase cycle, like a thermosiphon or heat pipe, it does not have some of the key characteristics of such devices. Unlike a thermosiphon, the device of the invention is orientation insensitive. Unlike a heat pipe, which has a discrete wick, such as a screen or axial grooves, the invention relies upon a planar capillary fluid path formed in the body of the device. The geometry of the planar capillary fluid path avoids the relatively high hydrodynamic resistance wick of existing heat pipes. In addition, the configuration of the capillary fluid path, in certain embodiments, eliminates the countercurrent viscous shear force between liquid flow in the condenser and vapor flow in the evaporator, a problem associated with existing heat pipes and thermosiphons. Finally, the configuration of the device facilitates low-cost, high volume manufacturing.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
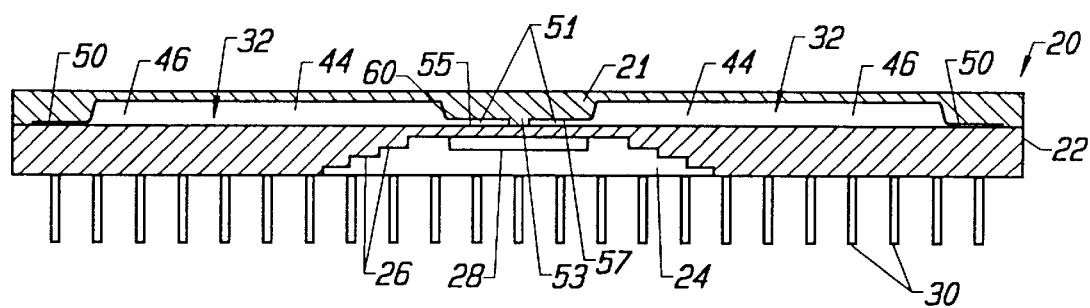
FIG. 1 is a cross-sectional view of a heat spreader formed in accordance with one embodiment of the invention.

FIG. 1 is a cross-sectional view of a heat spreader body 20 formed with a first planar body 22, in the form of a semiconductor package, and a second planar body 21, in the form of a lid. The semiconductor package 22 is a standard pin grid array package with a semiconductor void 24, which includes bond shelves 26. At the base of the semiconductor void 24 is a semiconductor 28. Bond wires (not shown) electrically couple the semiconductor 28 to the semiconductor package 22, which includes internal traces (not shown) with electrical connections to a set of package pins 30.

The lid 21 has a physical contour such that when it is attached to the semiconductor package 22 it defines a void with a non-capillary region 32. The non-capillary region 32 includes an adiabatic region 44 and a condenser 46. The void also includes a planar capillary fluid path 50, which includes an evaporator 51.

Heat produced by the semiconductor 28 migrates to the top of the semiconductor package 22. The generated heat is largely applied to the evaporator 51 of the heat spreader 20. Most of the heat is applied to the bottom surface 55 of the evaporator 51, some of the heat conducts through a heat transfer pillar 53 to heat the top surface 57 of the evaporator 51. Fluid within the evaporator 51 absorbs heat and vaporizes. The resultant vapor moves through the adiabatic region 44 where it does not loose or gain heat. It continues to move to the condenser region 46 where it cools and condenses on the interior walls of the device. The condensed liquid is then drawn, through capillary fluid action, into the planar capillary fluid path 50. That is, the small dimensions of the device, discussed in detail below, result in liquid being drawn by capillary action from the non-capillary region 32, in particular the condenser 46, into the planar capillary fluid path 50. The planar capillary fluid path 50 leads back to the evaporator 51. Thus, the two-phase vaporization-condensation cycle repeats itself. This cycle results in heat produced by the semiconductor 28 being distributed over a relatively large area, instead of being localized near the semiconductor 28.

Observe that the evaporator 51 generally corresponds to the size of the semiconductor 28. Similarly, the lid 21 generally corresponds to the size of the semiconductor package 22.

Figure 2:
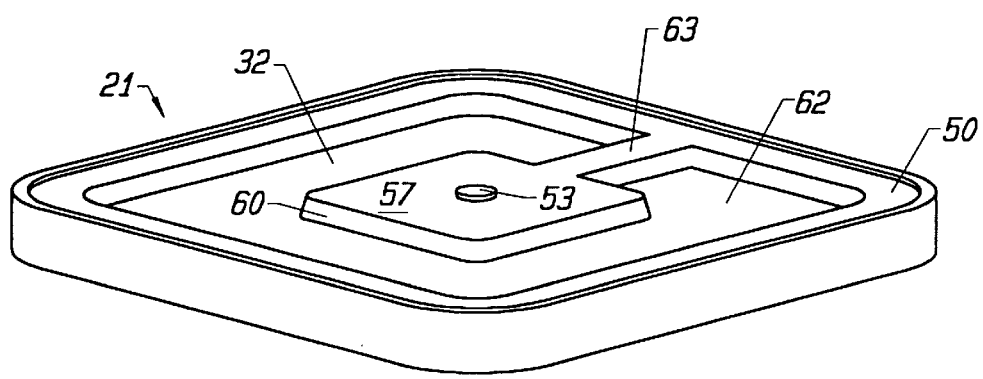
FIG. 2 is a perspective view of a portion of the heat spreader shown in FIG. 1.

The operation of the invention is more fully appreciated with reference to FIG. 2, which is a perspective view of the heat spreader lid 21. The figure illustrates a heat transfer pillar 53, which is formed on an evaporator surface 57 of an evaporator plateau 60. The evaporator plateau 60 rises from a non-capillary region surface 62. The planar capillary fluid path 50 is also formed above the non-capillary region surface 62. A fluid path bridge 63 links the planar capillary fluid path 50 with the evaporator plateau 60. Thus, the planar capillary fluid path 50 effectively includes the fluid path bridge 63 and the evaporator surface 57 of the evaporator plateau 60.

Those skilled in the art will recognize a number of unique attributes associated with the present invention. As indicated above, the dimensions of the device result in capillary action from the non-capillary region 32 to the planer capillary fluid path 50. This capillary action results regardless of the physical orientation of the device in relation to gravity. Thus, unlike a thermosiphon which must be used with a single orientation to gravity, the device of the invention is not limited in this manner.

The planar capillary fluid path 50 executes a wicking operation associated with heat pipes. However, unlike existing heat pipes, the wicking operation does not rely upon a separate structure, such as a screen. Instead, the planar capillary fluid path 50 is formed out of the body of the device. Thus, the expense associated with prior art heat pipes is avoided. In addition, the relatively high hydrodynamic resistance of a discrete wick structure is avoided.

Another advantage of the disclosed apparatus is that the circumferential motion of fluid in the fluid path 50 is never directly counteracted by the motion of vapor in the evaporator 51. In most heat pipes and thermosiphons, vapor moves one direction and liquid moves in an opposite direction. As a result, in these prior art devices a countercurrent viscous shear force exists between liquid flow and vapor flow, a problem avoided with the embodiment of FIG. 1.

As shown in FIG. 1, the size of the heat spreader 20 substantially conforms to the size of the semiconductor package 22 to which it is attached. This feature, coupled with the low vertical profile of the device makes it ideal for use with compact electronic equipment. The low vertical profile also makes the device ideal for use with other cooling devices, such as fans or finned heat sinks. As demonstrated below, the device of the invention is far more efficient at spreading heat than a solid metal slug of comparable dimensions.

The heat spreader lid 21 is preferably formed of metal, for example aluminum. The heat spreader lid 21 may be soldered or brazed to the semiconductor package 22. The vertical clearance of the region defining the condenser 46 is preferably less than 1.0 mm, preferably between and 0.75 mm and 0.25 mm, and most preferably approximately 0.375 mm. The vertical clearance of the region defining the evaporator and the planar capillary fluid path 50 is preferably less than 0.5 mm, preferably between 0.325 and 0.025 mm, most preferably approximately 0.125 mm.

The device of the invention may be formed by machining, by stamping, chemical etching, chemical depositing or any other technique known in the art. To insure proper wetting within the heat spreader 20, the surfaces within the body should he thoroughly cleaned. The two halves are preferably brazed. Thereafter, standard charging techniques are used to place the fluid within the body. Typically, a vacuum pump is then used to remove non-condensable gases from the void. This operation is facilitated if the fluid is frozen so that the vacuum pump does not remove the fluid itself. Afterwards, only fluid exists in the void. At this point the pressure within the void is proportional to the vapor pressure of the fluid at the existing temperature. The body is then sealed to preserve conditions in the void.

Figure 3:
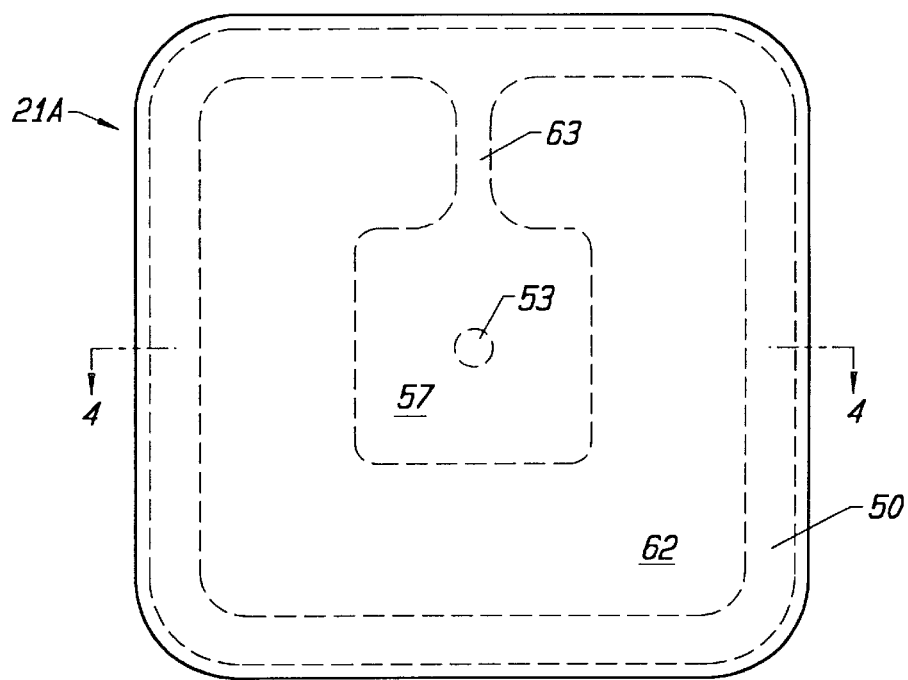
FIG. 3 is a top view of a portion of a heat spreader in accordance with an embodiment of the invention.

FIG. 3 is a top view of a heat spreader body portion 21A. The device of FIG. 3 is used with a corresponding heat spreader bottom to form a heat spreader in accordance with the invention. In such a configuration, both halves of the device are contoured, as opposed to the implementation of FIG. 1, where only one body portion of the device is contoured.

Figure 4:
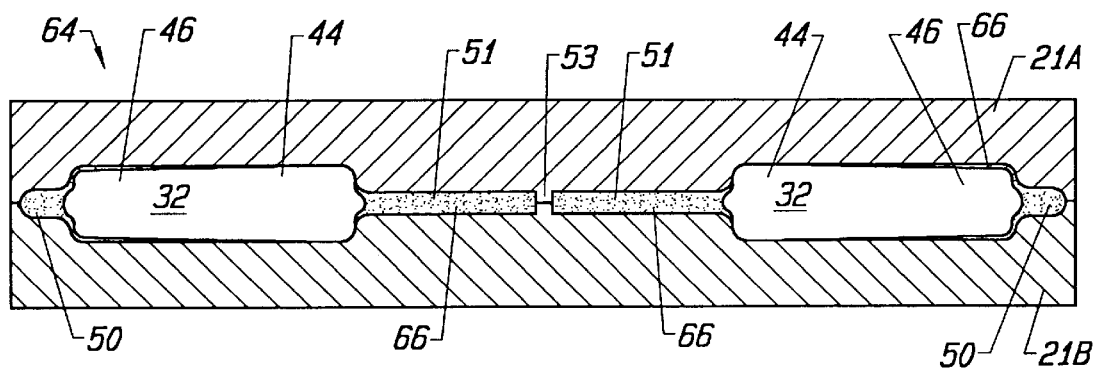
FIG. 4 is a cross-sectional view taken along the line 4—4 of FIG. 3, showing fluid within the heat spreader.

FIG. 4 illustrates a device 64 constructed with the heat spreader body portion 21A of FIG. 3. The device 64 includes a corresponding heat spreader bottom 21B. Thus, FIG. 4 can be interpreted as a cross-sectional view taken along the line 4—4 of FIG. 3.

FIG. 4 also illustrates fluid 66 positioned within the evaporator 51 and the fluid path 50. Further, the figure illustrates the fluid 66 wicking into the fluid path 50. The figure illustrates that there is very little fluid on the walls of the adiabatic region 44, and a small amount of fluid on the walls of the condenser 46.

Figure 4A:
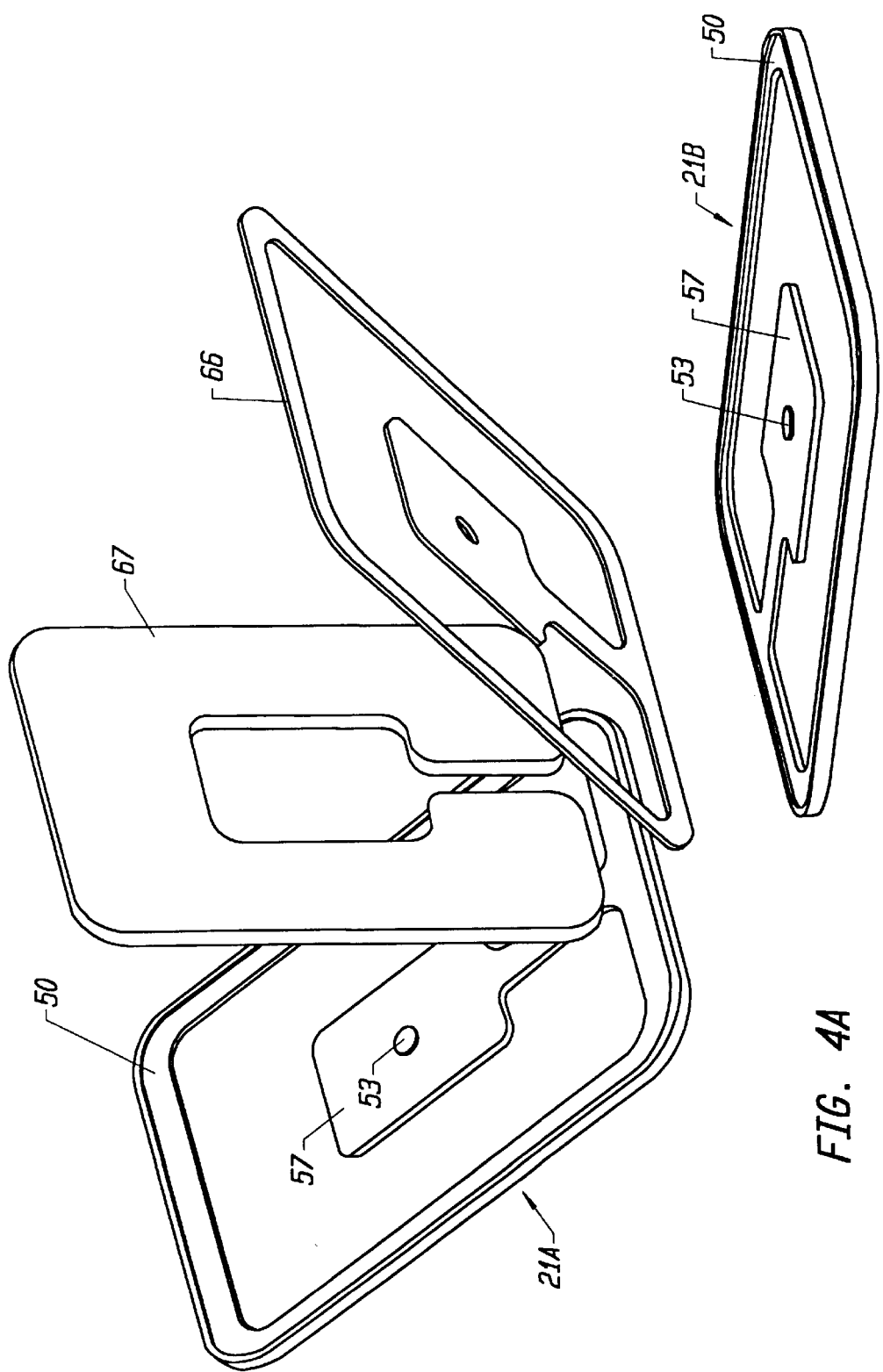
FIG. 4A is an exploded view of the apparatus of FIG. 4.

FIG. 4A is an exploded view of the device of FIG. 4. The figure illustrates the heat spreader top 21A and the heat spreader bottom 21B. The figure also illustrates that the fluid 66 fills the capillary fluid path 50. Thus, the shape of the fluid 66 is equivalent to the shape of the capillary fluid path 50. FIG. 4A also illustrates a special region 67. The special region 67 conforms to the shape of the non-capillary region 32. Thus, the special region 67 can be thought of as the area where vapor exists. As shown in FIG. 4 and as discussed below, in addition to vapor, some fluid does exist in the special region 67.

Figure 5:
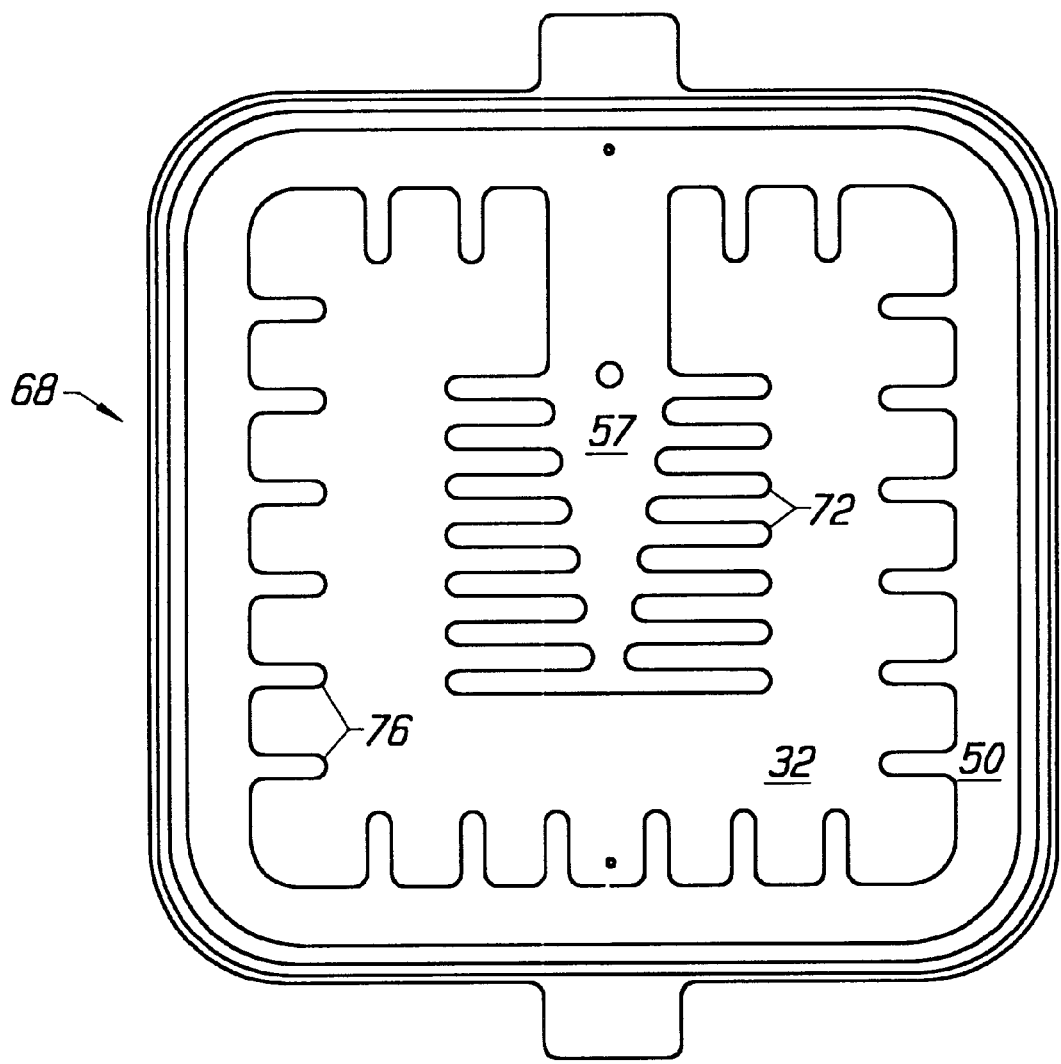
FIG. 5 is an alternate configuration of a portion of a heat spreader in accordance with an embodiment of the invention.

FIG. 5 is a top view of a heat spreader lid 68. The heat spreader lid 68 of FIG. 5 includes an evaporator surface 57 with extended edge surface elements 72. Since vapor can only leave the evaporator surface 57 at an edge, the configuration of FIG. 5 provides an extended surface into the non-capillary region 32 to facilitate vapor entry. FIG. 5 also illustrates a capillary fluid path 50 with extended edge surface elements 76. The extended edge surface elements 76 facilitate the capillary movement of fluid from the non-capillary region 32 to the fluid path 50. A tapered surface between the extended edge surface elements 76 and the condenser non-capillary region 32 is preferable to facilitate capillary fluid movement. Preferably, all embodiments of the invention avoid abrupt surface transitions.

Figure 6:
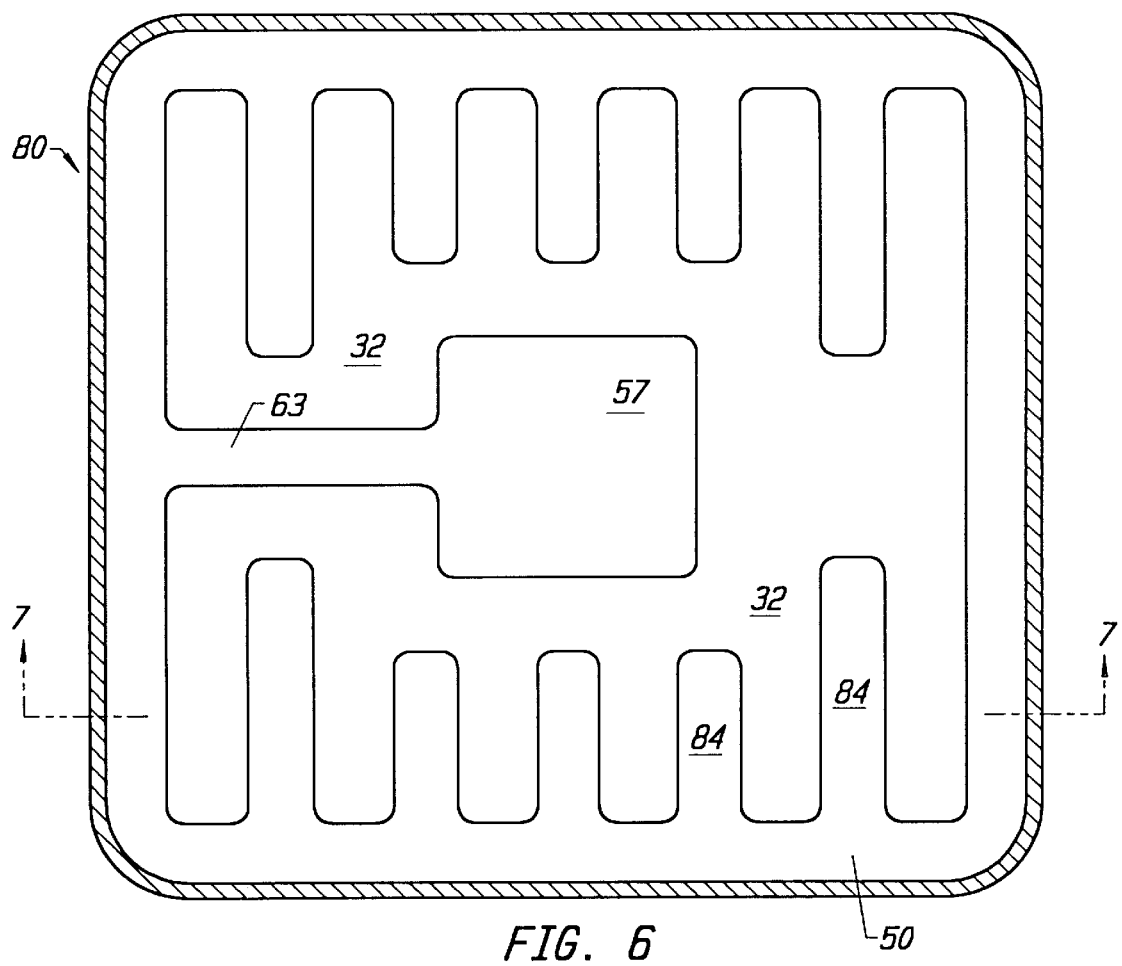
FIG. 6 is a top view of a heat spreader with an extended surface planar capillary fluid path, in accordance with one embodiment of the invention.

FIG. 6 illustrates an alternate heat spreader body 80 formed in accordance with the invention. The body 80 includes an evaporator plateau surface 57 connected to a fluid path bridge 63, which leads to a capillary fluid path 50. The capillary fluid path 50 includes extended surface elements in the form of peninsulas 84. The peninsulas 84 are larger than the extended surface elements 76 of FIG. 5, but they serve the same purpose of facilitating the capillary movement of fluid from the non-capillary region 32 to the capillary fluid path 50.

Figure 7:
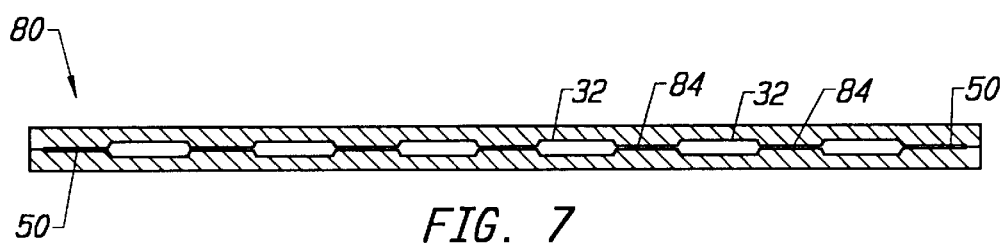
FIG. 7 is a cross-sectional view taken along the line 7—7 of FIG. 6.

FIG. 7 is a cross-sectional view of the device 80 taken along the line 7—7 of FIG. 6. The capillary path 50 may be observed on either end of the figure. The peninsulas 84 may also be observed between non-capillary regions 32.

Unlike the heat spreader lid 21 of FIG. 1, which forms a body with a semiconductor package, the device of FIGS. 6 and 7 is a discrete component. Preferably, the total vertical height of the device of FIG. 7 is less than 2.0 mm, preferably approximately 1.5 mm. The vertical height of the non-capillary region 32 is consistent with the previously described embodiment. Similarly, the vertical height associated with the path 50 is consistent with the previously described embodiment.

Figure 8:
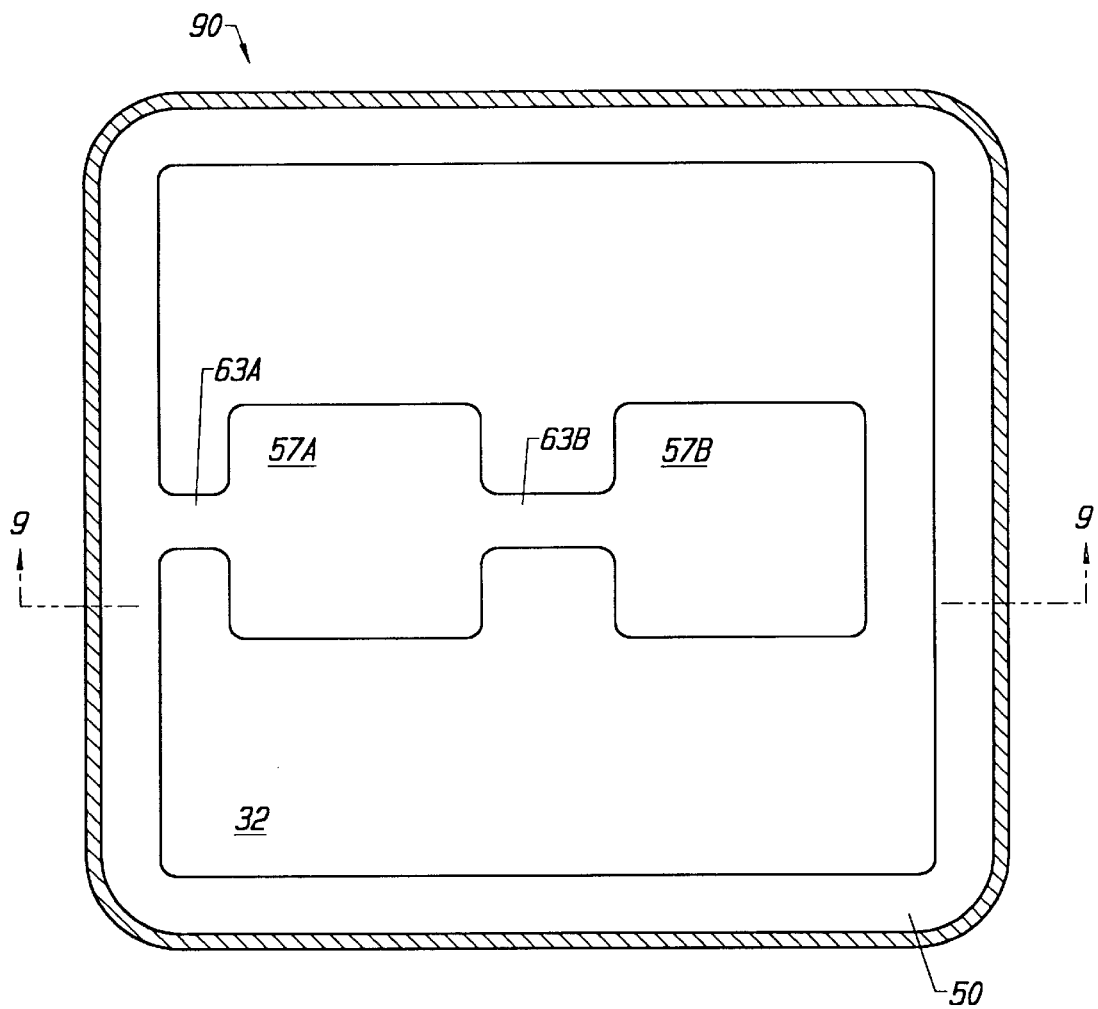
FIG. 8 is a top view of a dual heat source heat spreader body in accordance with another embodiment of the invention.

FIG. 8 is a top view of a dual heat source heat spreader body 90. The device 90 includes a first evaporator surface 57A and a second evaporator surface 57B. The first evaporator surface 57A is positioned over a first heat source, such as a semiconductor (not shown), while the second evaporator surface 57B is positioned over a second semiconductor (not shown). A first fluid path bridge 63A attaches the first evaporator surface 57A to the planar capillary fluid path 50, while a second fluid path bridge 63B attaches the first evaporator surface 57A to the second evaporator surface 57B. Preferably, a single non-capillary region 32 serves both evaporator regions defined by the evaporator surfaces 57A, 57B. In other words, the non-capillary region 32 has an open path between the two sides of the evaporator surfaces 57A, 57B.

Figure 9:
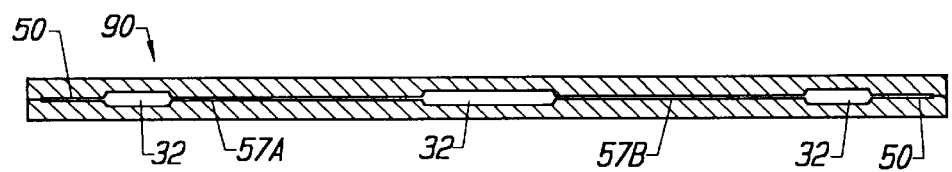
FIG. 9 is a cross-sectional view taken along the line 9—9 of FIG. 8.

FIG. 9 is a cross-sectional view taken along the line 9—9 of FIG. 8. FIG. 9 illustrates the planar capillary fluid path 50 at either end of the body 90. The figure also illustrates the first evaporator surface 57A positioned between non-capillary regions 32 and the second evaporator evaporator surface 57B positioned between non-capillary regions 32.

Figure 10:
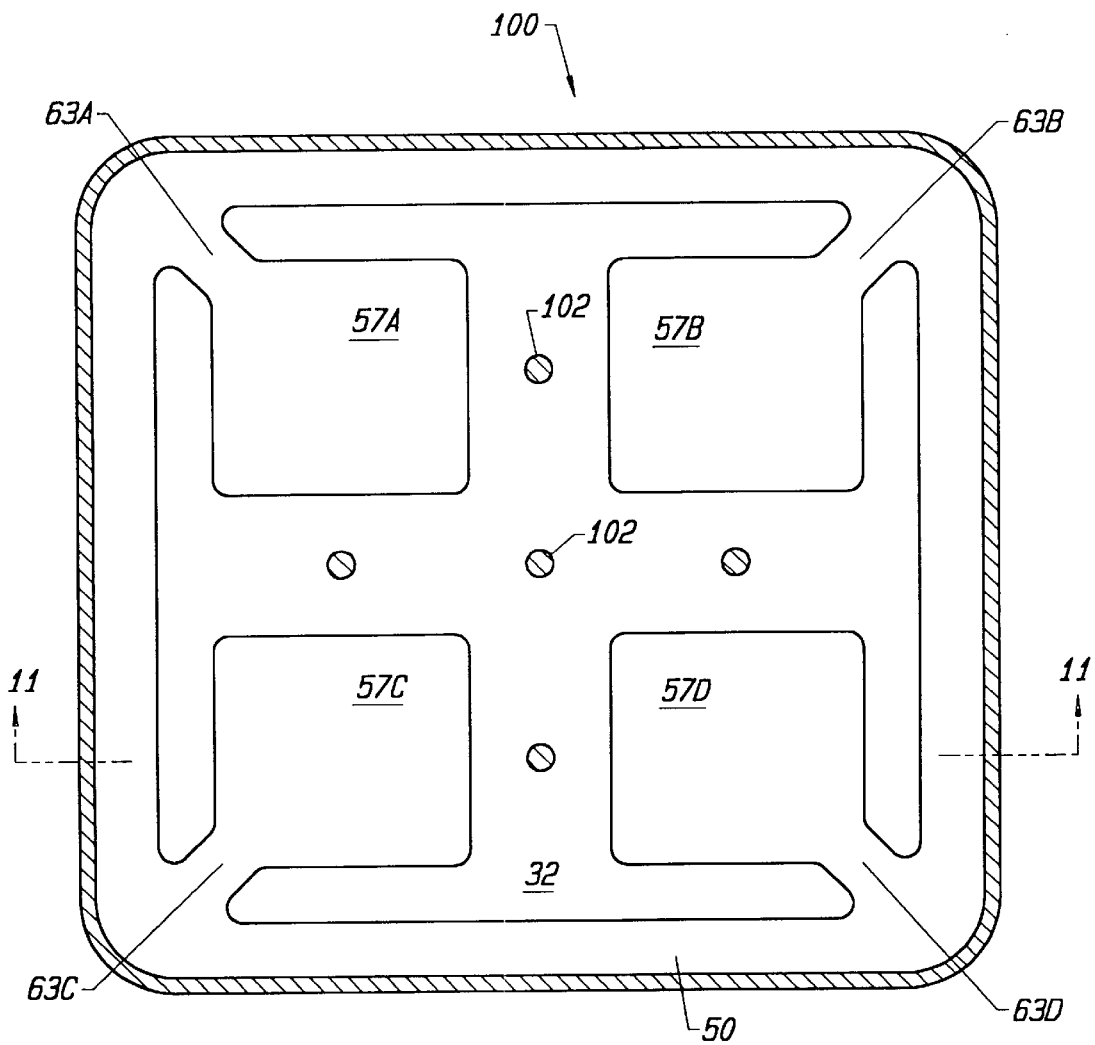
FIG. 10 is a top view of a quad heat source heat spreader body in accordance with another embodiment of the invention.

FIG. 10 illustrates a quad heat source heat spreader body 100. The body 100 is used in connection with a semiconductor package that houses four semiconductors. The body 100 includes a first evaporator surface 57A, a second evaporator surface 57B, a third evaporator surface 57C, and a fourth evaporator surface 57D. First, second, third, and fourth fluid path bridges 63A, 63B, 63C, and 63D are used to link the evaporator plateaus to the planar capillary fluid path 50. The non-capillary region 32 includes support pillars 102. The support pillars 102 operate as heat transfer pillars. The support aspect of the pillars 102 is important to prevent collapse of the non-capillary region 32 under vacuum conditions.

Figure 11:
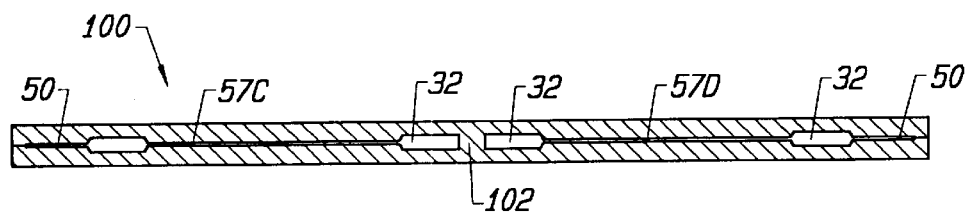
FIG. 11 is a cross-sectional view taken along the line 11—11 of FIG. 10.

FIG. 11 is a cross-sectional view taken along the line 11—11 of FIG. 10. The figure illustrates the planar capillary fluid path 50, the evarporator surfaces 57C and 57D, the non-capillary region 32, and the support pillar 102.

Figure 12:
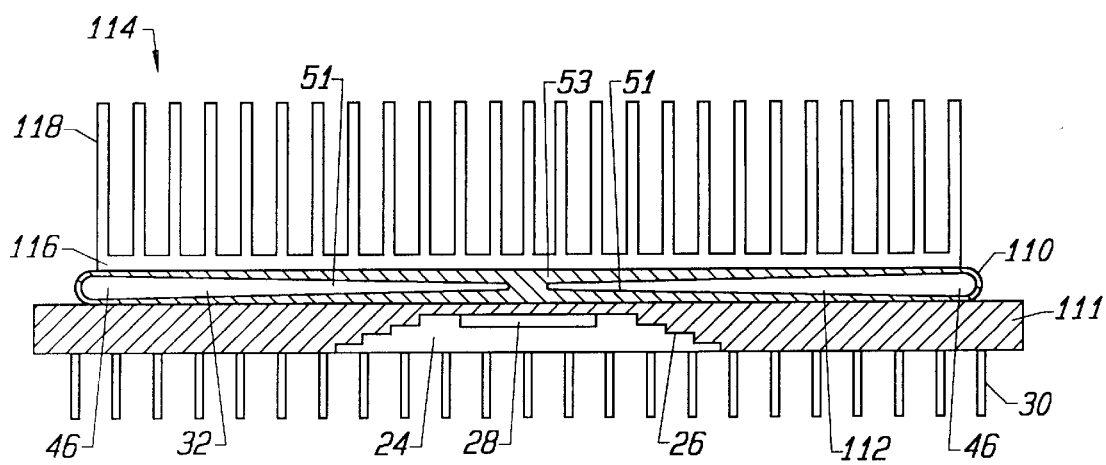
FIG. 12 is a cross-sectional view of an alternate heat spreader body configuration in accordance with the invention.

FIG. 12 is another embodiment of a heat spreader body 110 formed in accordance with the invention. The heat spreader body 110 is positioned on a semiconductor package 111. A finned heat sink 114 is positioned on the body 110. The finned heat sink 114 includes a horizontal surface 116 supporting vertical fins 118.

The heat spreader body 110 includes a sloping planar surface 112 extending from the evaporator 51 to the condenser 46 of the non-capillary region 32. The sloping planar surface 112 may be configured as a frustum of a cone. Liquid in the condenser 46 is drawn back to the evaporator 51 by the capillary action of the sloping planar surface 112. That is, capillary action draws fluid from the relatively larvae vertical clearance of the condenser 46 into the relatively small vertical clearance of the evaporator 51. Thus, this embodiment of the invention does not have a perimeter planar capillary fluid path. Instead, fluid is condensed in the non-capillary region 32 and is then drawn by capillarity into the evaporator 57, without the use of a fluid capillary path bridge. The advantage of this embodiment is that the fluid will be drawn into the evaporator 51 through multiple naturally-formed fluid capillary paths on surface 112.

Figure 13:
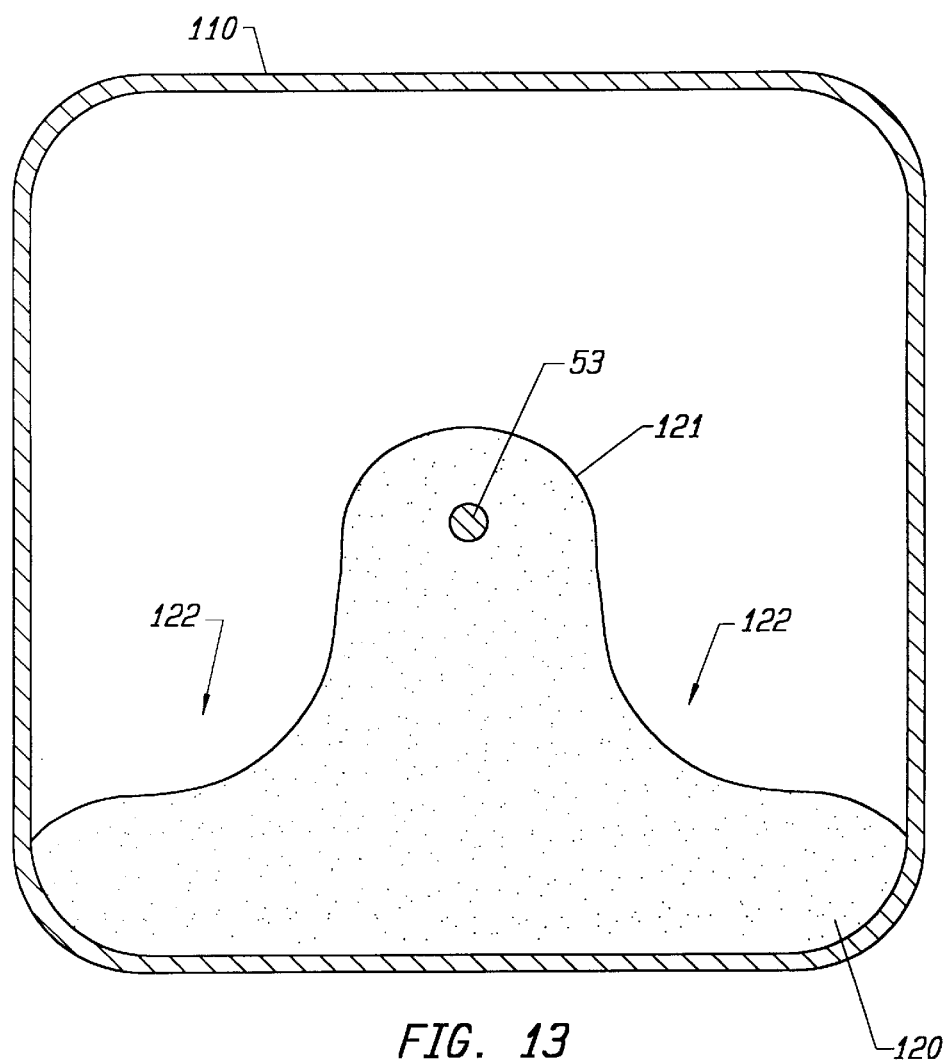
FIG. 13 illustrates the fluid pattern within the heat spreader body of FIG. 12 when it is vertically oriented with respect to gravity.

FIG. 13 illustrates the heat spreader body 110 of FIG. 12 in a vertical position with respect to gravity. The figure further illustrates the capillary action of a fluid within the body. Capillary action causes the fluid 120 to surround the heat transfer pillar 53. In addition, capillary action causes an upward extension of fluid 121 along the walls of the body 110, resulting in a concave fluid shape 122. FIG. 13 illustrates the directional insensitivity of the device of the invention, this feature is an important benefit of the invention.

Figure 14:
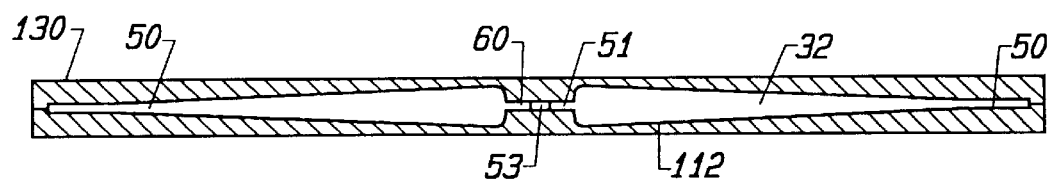
FIG. 14 is a cross-sectional view of an alternate heat spreader body configuration in accordance with the invention.

FIG. 14 is a cross-sectional view of still another heat spreader body 130 in accordance with the invention. In this embodiment, the sloping planar surface 112 results in a large vertical clearance at the non-capillary region 32, which is proximately positioned to the evaporator 51. The large vertical clearance at the non-capillary region 32 results in a relatively low vapor pressure adjacent to the evaporator 51 to facilitate the vaporization of fluid in the evaporator 51. The sloping planar surface 112 extends to a planar capillary fluid path 50 at the perimeter of the body 130. The shape of the planar capillary fluid path 50 is shown in FIG. 3. However, unlike the embodiment of FIG. 3, in the embodiment of FIG. 13, a gentle slope exists between the path 50 and the non-capillary region 32.

Figure 15:
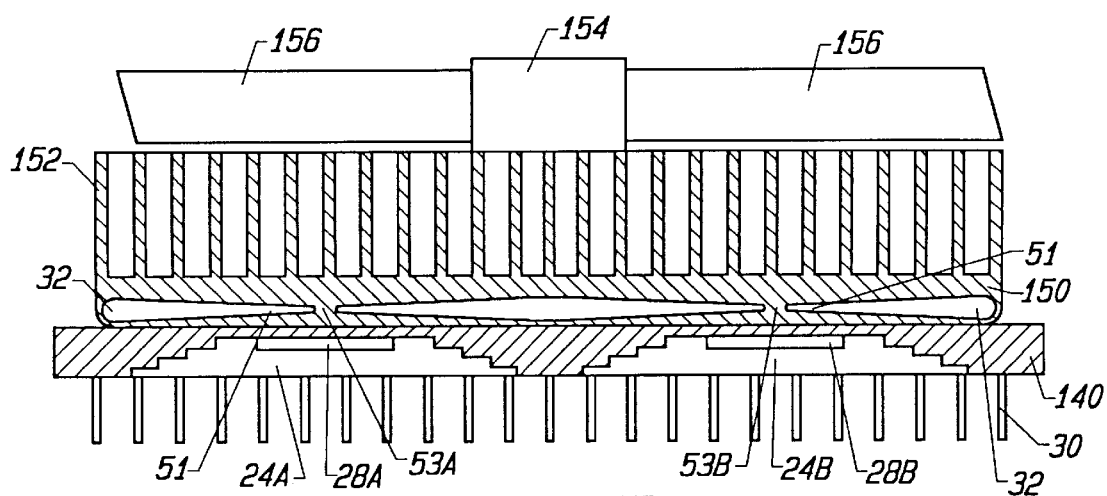
FIG. 15 is a cross-sectional view of an alternate dual heat source heat spreader body in accordance with the invention.

FIG. 15 is a cross-sectional view of a heat spreader body 150 that integrally incorporates heat sink fins 152. The heat spreader body 150 is for use with a multi-chip semiconductor package 140, which houses a first semiconductor 28A and a second semiconductor 28B. The body 150 includes a first heat transfer pillar 53A surrounded by an evaporator 51 and a non-capillary region 32. In addition, the body includes a second heat transfer pillar 53B surrounded by an evaporator 51 and a non-capillary region 32. Once again, a sloping surface is used between the evaporator 51 and the non-capillary region 32, and thereby enjoys the previously described advantages.

FIG. 15 further illustrates a fan 154, including fan blades 156, positioned on top of the heat sink fins 152. The positioning of a fan 154 on or within heat sink fins 152 is known in the art. The present invention facilitates this practice by providing a low vertical profile mechanism to distribute heat from the center of a semiconductor package to the edge of a semiconductor package where the fan performs the most active cooling.

Figure 16:
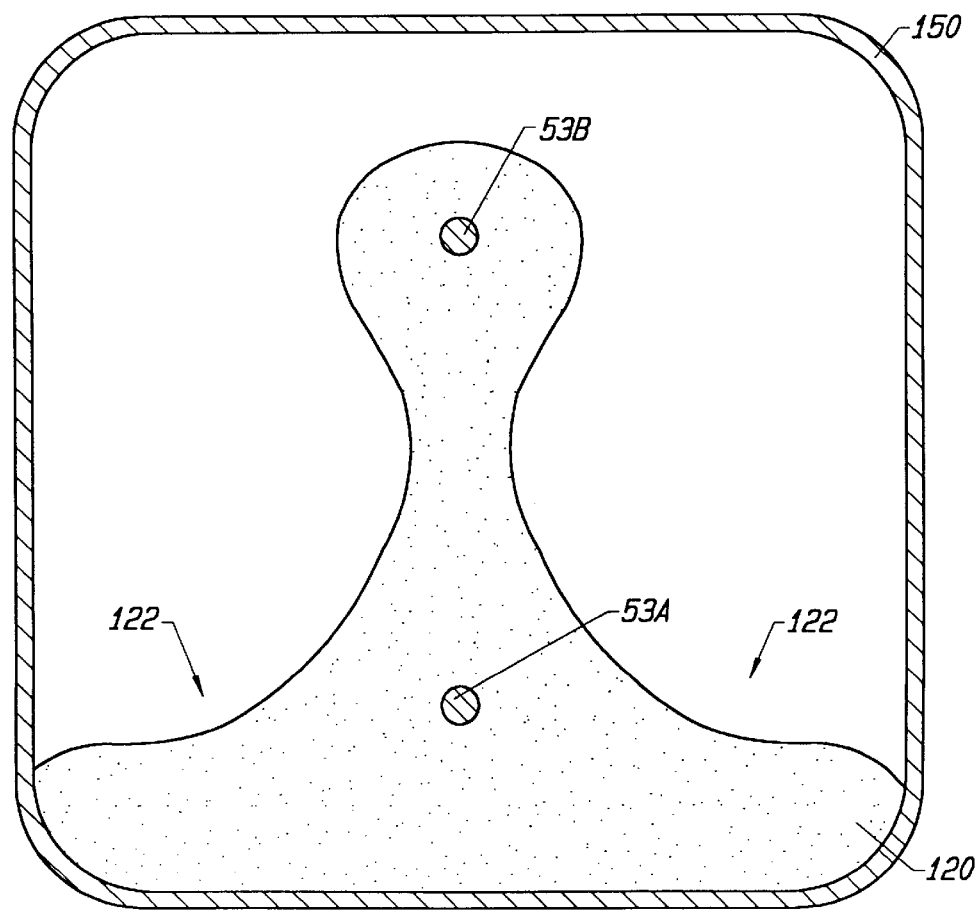
FIG. 16 illustrates the fluid pattern within the heat spreader body of FIG. 15 when it is vertically oriented with respect to gravity.

FIG. 16 illustrates the body 150 of FIG. 15 in a vertical position. The figure also illustrates the fluid within the body 150. Capillary action within the void of the body 150 causes fluid to surround the two heat transfer pillars 53A and 53B. As mentioned previously, when in a horizontal orientation to gravity, the capillary action toward the heat transfer pillars 53A and 53B will result in multiple natural capillary paths into the evaporator 51.

Figure 17:
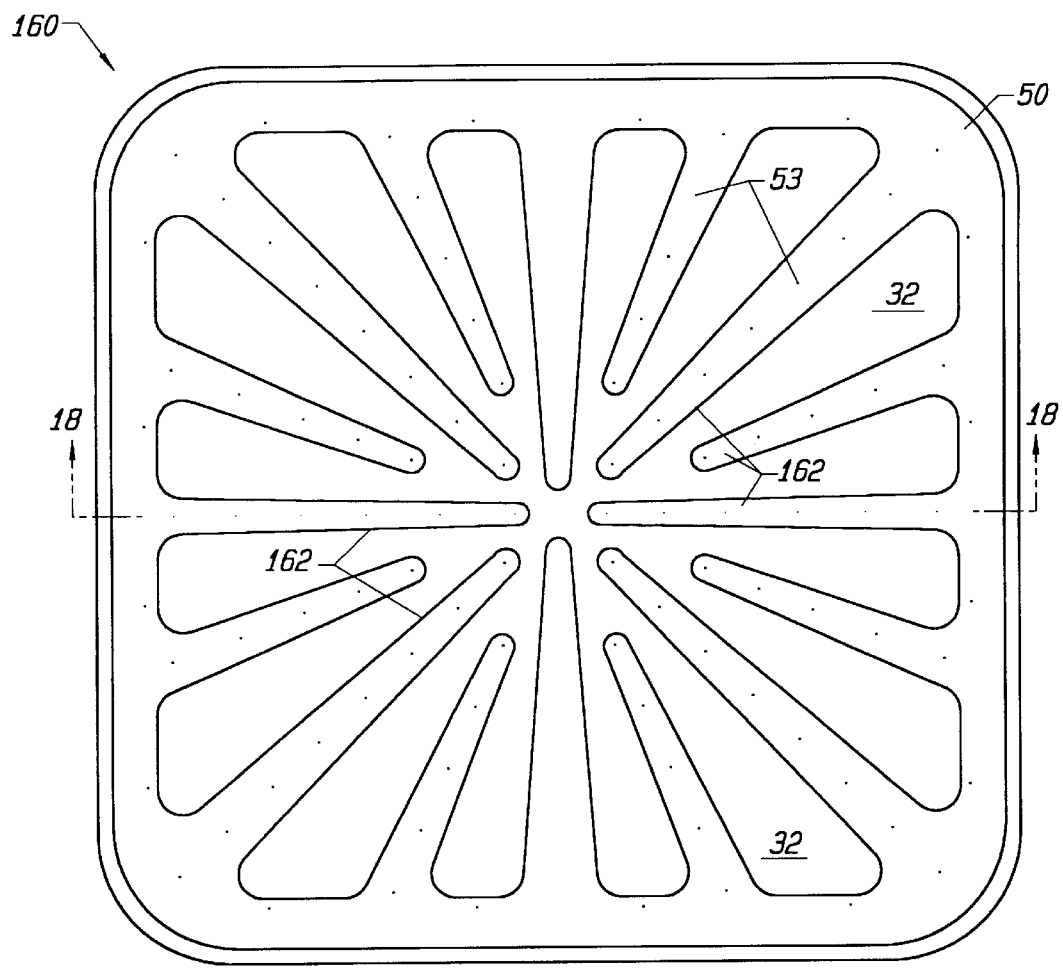
FIG. 17 is a top view of the bottom body portion of a "radial" heat spreader configuration in accordance with an embodiment of the invention.

FIG. 17 illustrates a "radial" heat spreader embodiment of the invention. The term "radial" refers to the contour of the non-capillary region 32, which exists at the center of the device and extends from the center in sixteen different directions, in a radial pattern. The fluid capillary path 50 exists on the perimeter of the device and extends to the center of the device with sixteen different legs 162. The advantages of this embodiment are the numerous fluid capillary path 50 and non-capillary region 32 edges and the fact that vapor can easily migrate to practically any region of the radial non-capillary region 32. Similarly, there are many fluid capillary path legs back to the center of the device.

Figure 18:
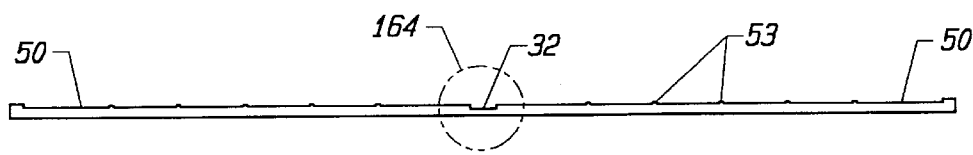
FIG. 18 is a cross-sectional view taken along the line 18—18 of FIG. 17.

FIG. 18 is a cross-sectional view of the device of FIG. 17 taken along the line 18—18. The figure shows the non-capillary region 32 at the center of the structure. Similarly, the figure shows two fluid capillary paths 50 extending into the non-capillary region 32. Liquid evaporates at the end of these fluid capillary paths 50 and enters the non-capillary region 32. Then, in most cases, the vapor migrates out to the perimeter regions of the non-capillary region 32. FIG. 18 also illustrates heat transfer pillars 53. As in previous embodiments, these pillars 53 also operate as support structures.

Figure 19:
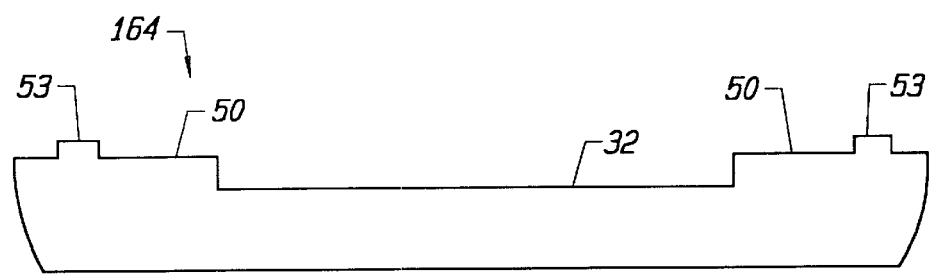
FIG. 19 is an enlarged view of a portion of the apparatus of FIG. 18.

FIG. 19 is an enlarged view of the center region 164 shown in FIG. 18. FIG. 19 illustrates the non-capillary region 32, the end of the fluid capillary paths 50, and the heat transfer pillars 53 positioned on the fluid capillary paths 50.

Figure 20:
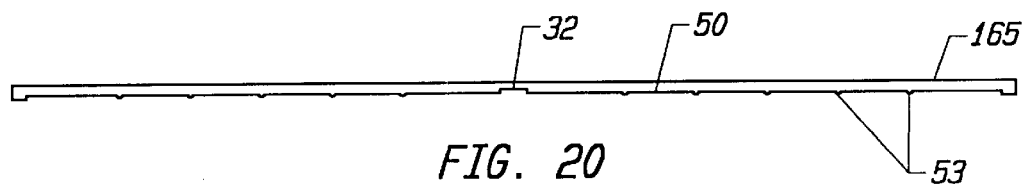
FIG. 20 is a side view of the top body portion to be used with the heat spreader of FIG. 19.

FIG. 20 is a side-view of a top body portion that is used for connection to the bottom body portion shown in FIG. 16. FIG. 20 illustrates a recessed region for forming the non-capillary region 32. In addition, the figure illustrates the ceiling portion of the fluid capillary paths 50 and heat transfer pillars 53, which are mated with the heat transfer pillars 53 shown in FIG. 18.

Figure 21:
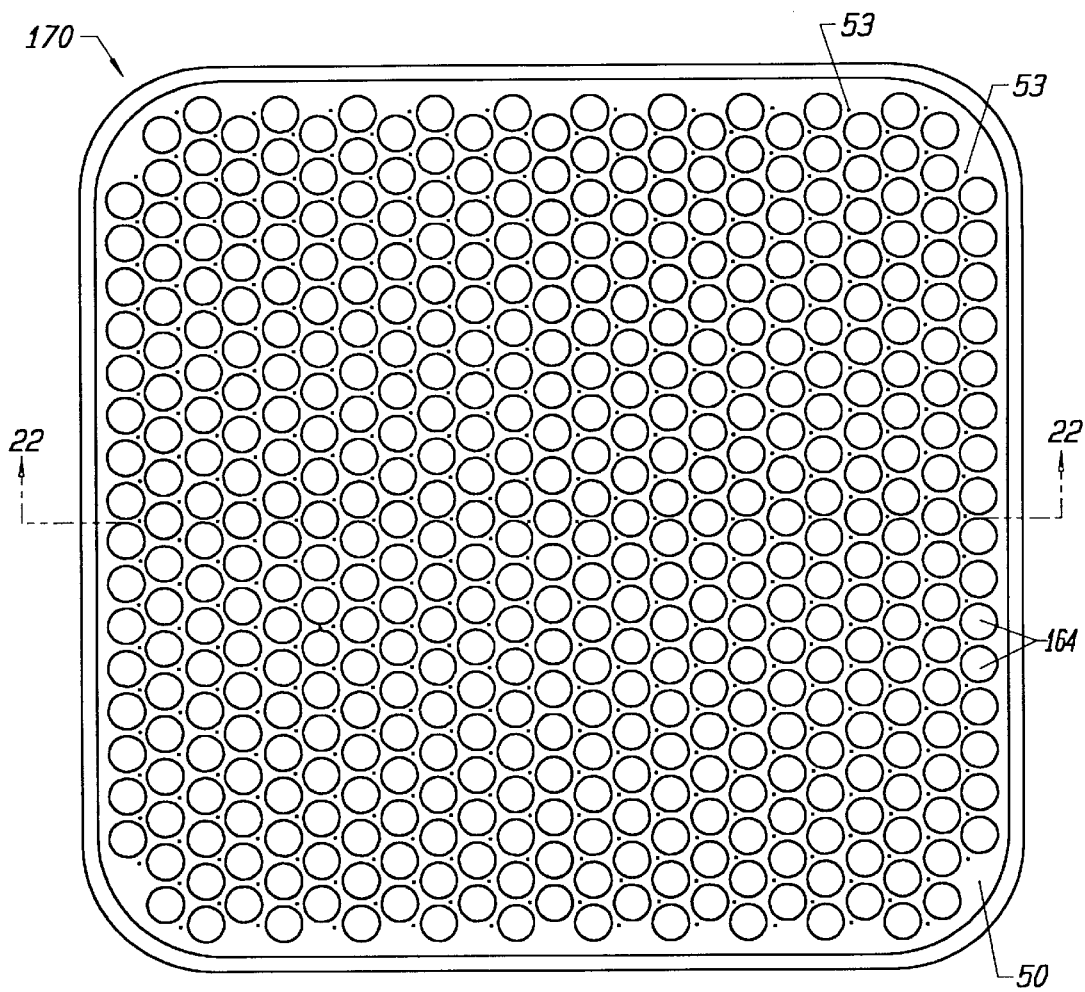
FIG. 21 is a top view of the bottom body portion of a "circle array" heat spreader configuration in accordance with an embodiment of the invention.

FIG. 21 is a top view of the bottom body portion of a "circle array" heat spreader apparatus 170 in accordance with an embodiment of the invention. In this configuration of the invention, the non-capillary region 32 is in the form of a large number of discrete circular wells 164. The fluid capillary path 50 surrounds each of the non-capillary regions 164. FIG. 21 also illustrates a large number of heat transfer pillars 53. This embodiment of the invention is advantageous because it allows fluid to easily migrate to almost any region of the structure. In addition, the embodiment provides a large number of edge surfaces for fluid to evaporate from the fluid capillary path 50 and to return to the fluid capillary path 50. Further, the structure has a "universal" configuration that is effective with a single chip package, a dual chip package, or any other type of multi-chip module.

Figure 22:
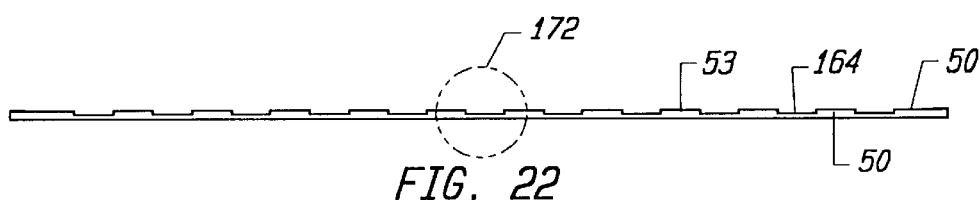
FIG. 22 is a cross-sectional view taken along the line 22—22 of FIG. 21.

FIG. 22 is a side view taken along the line 22—22 of FIG. 21. The figure shows different non-capillary regions 164 surrounded by segments of the fluid capillary path 50. The figure also illustrates heat transfer pillars 53 positioned in the fluid capillary path 50.

Figure 23:
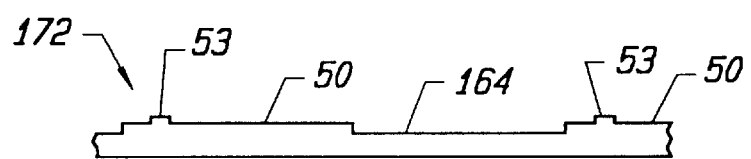
FIG. 23 is an enlarged view of a portion of the apparatus of FIG. 22.

FIG. 23 is an enlarged view of the region 172 of FIG. 22. FIG. 23 illustrates a non-capillary region 164 surrounded by a fluid capillary path 50, which includes heat transfer pillars 53.

Figure 24:
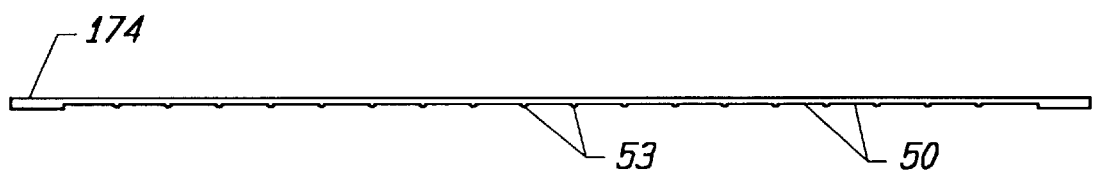
FIG. 24 is a side view of the top body portion to be used with the heat spreader of FIG. 21.

FIG. 24 is a top body portion 174 corresponding to the bottom body portion 170 of FIG. 21. The top body portion 174 is configured to mate with the bottom body portion 170. Thus, the top body portion 174 includes a fluid capillary path ceiling 50 with heat transfer pillars 53 for alignment with the same elements on the bottom body portion.

Figure 25:
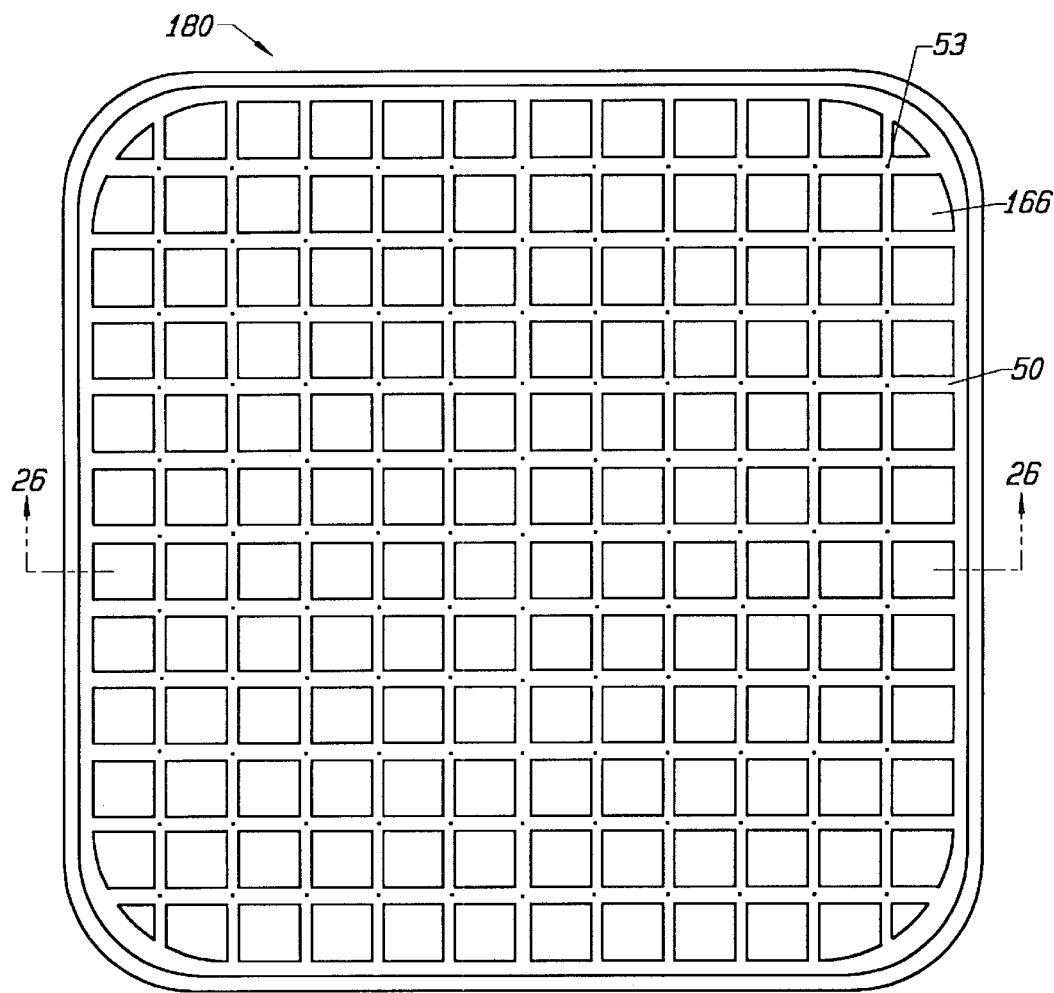
FIG. 25 is a top view of the bottom body portion of a "square matrix" heat spreader configuration in accordance with an embodiment of the invention.

FIG. 25 is a top view of the bottom body portion of a "square matrix" heat spreader apparatus 180 in accordance with an embodiment of the invention. In this embodiment, the fluid capillary path 50 is shaped like a grid and discrete square non-capillary regions 166 punctuate the grid. The embodiment also includes heat transfer pillars 53.

Figure 26:
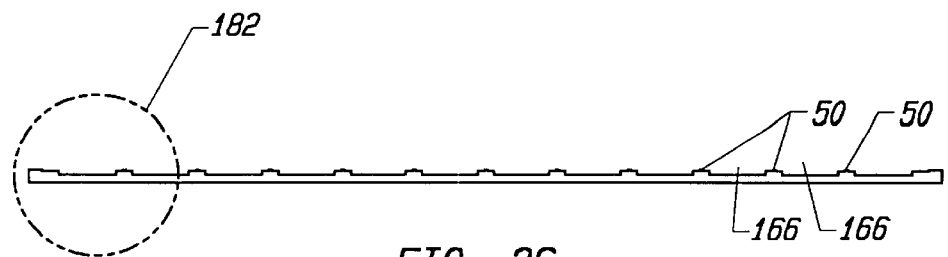
FIG. 26 is a cross-sectional view taken along the line 26—26 of FIG. 25.
Figure 27:
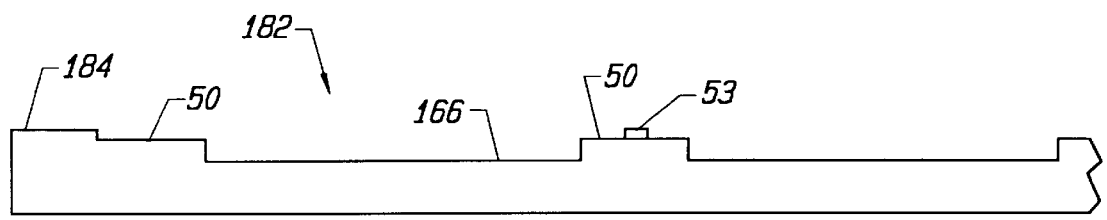
FIG. 27 is an enlarged view of a portion of the apparatus of FIG. 26.

FIG. 26 is a side view of the apparatus 180 taken along the line 26—26 of FIG. 25. The figure illustrates the fluid capillary path 50 surrounding different non-capillary regions 166. FIG. 27 is an enlarged view of the region 182 of FIG. 26. FIG. 27 illustrates fluid capillary paths 50 surrounding a non-capillary region 166. The figure also illustrates a heat transfer pillar 53. A perimeter plateau 184 for connection with a lid is also illustrated.

Figure 28:
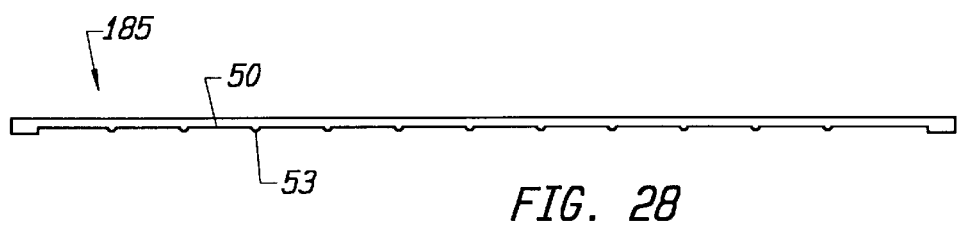
FIG. 28 is a side view of the top body portion to be used with the heat spreader of FIG. 24.

FIG. 28 illustrates a lid 185 for attachment to the apparatus 180 of FIG. 25. The lid 185 includes a fluid capillary path lid portion 50 with heat transfer pillars 53, which mate with the heat transfer pillars 53 of FIG. 25.

An advantage of the embodiment of the invention illustrated in FIGS. 25–28 is the ability of fluid to move in linear paths across the entire surface area of the device. In addition, the square configuration provides a relatively large amount of edge area for evaporated fluid to escape the fluid capillary path 50 and for condensed fluid to return to the fluid capillary path 50. Further, as in the case of the "circular array" configuration of FIGS. 21–24, the device of FIGS. 25–28 has a universal configuration that allows it to be effectively used with a variety of heat source distribution schemes.

Figure 29:
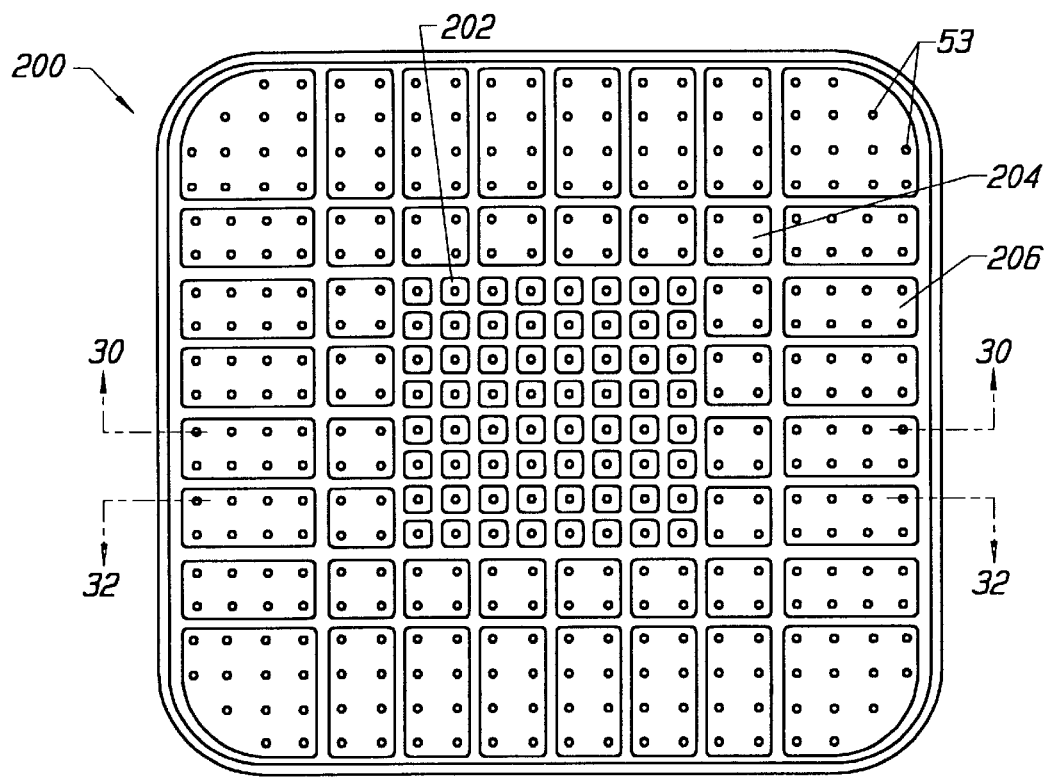
FIG. 29 is a top view of the bottom body portion of a "varying size square matrix" heat spreader configuration in accordance with an embodiment of the invention.

FIG. 29 illustrates another heat spreader 200 in accordance with the invention. The heat spreader 200 includes non-capillary regions of varying size. In particular, the figure illustrates small patterned non-capillary regions 202, larger patterned non-capillary regions 204, and still larger patterned non-capillary regions 206. The patterned non-capillary regions are generally square in FIG. 29, but other patterns, such as circles or triangles may also be used.

Figure 30:
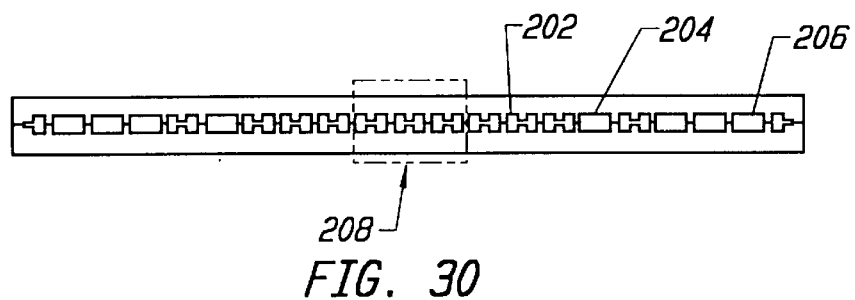
FIG. 30 is a cross-sectional view taken along the line 30—30 of FIG. 29.

FIG. 30 is a cross-sectional view taken alone the line 30—30 of FIG. 29. The figure illustrates non-capillary regions 202–206 of varying sizes. Heat transfer pillars interrupt the different non-capillary regions so the different non-capillary regions are somewhat difficult to identify. This effect is more fully appreciated with reference to FIG. 31.

Figure 31:
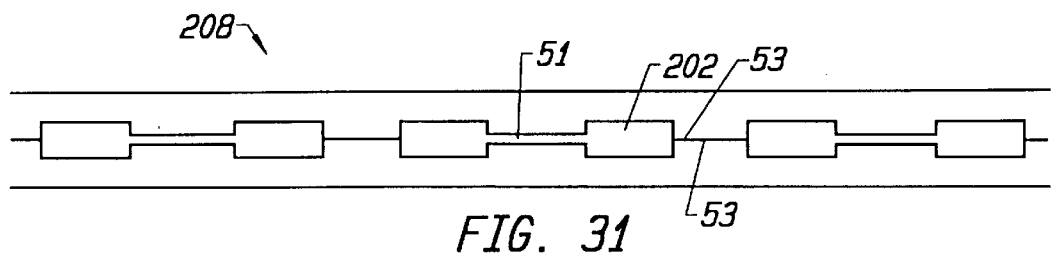
FIG. 31 is an enlarged view of a portion of the apparatus of FIG. 30.

FIG. 31 is an enlarged view of the region 208 of FIG. 30. FIG. 31 illustrates that corresponding heat transfer pillars 53 from two sides of the body meet to form a continuous pillar structure. In addition to providing physical support for the device and operating to conductively move heat from one side of the device to the other, these pillars are useful as condensing surfaces. In other words, they are useful to form additional condensing area for vaporized fluid. A contoured surface in the non-capillary regions may also be used to provide additional condensing area for the vaporized fluid.

Figure 32:
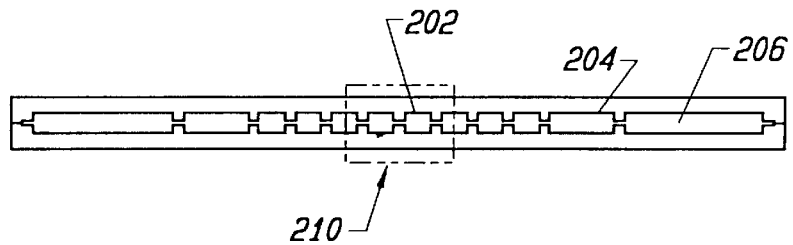
FIG. 32 is a cross-sectional view taken along the line 32—32 of FIG. 29.

FIG. 32 is a cross-sectional view taken along the line 32—32 of FIG. 29. The figure illustrates non-capillary regions 202–206 of varying size. Note that in this figure the different non-capillary regions are not divided-up by heat transfer pillars 53.

Figure 33:
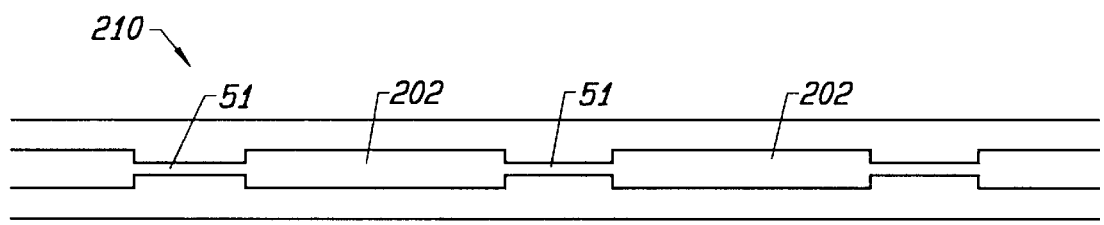
FIG. 33 is an enlarged view of a portion of the apparatus of FIG. 32.

FIG. 33 is an enlarged view of the region 210 of FIG. 32. FIG. 33 illustrates evaporator regions 51 formed between non-capillary regions 202. Observe once again that this figure is taken along a line that does not include heat transfer pillars 53.

Figure 34:
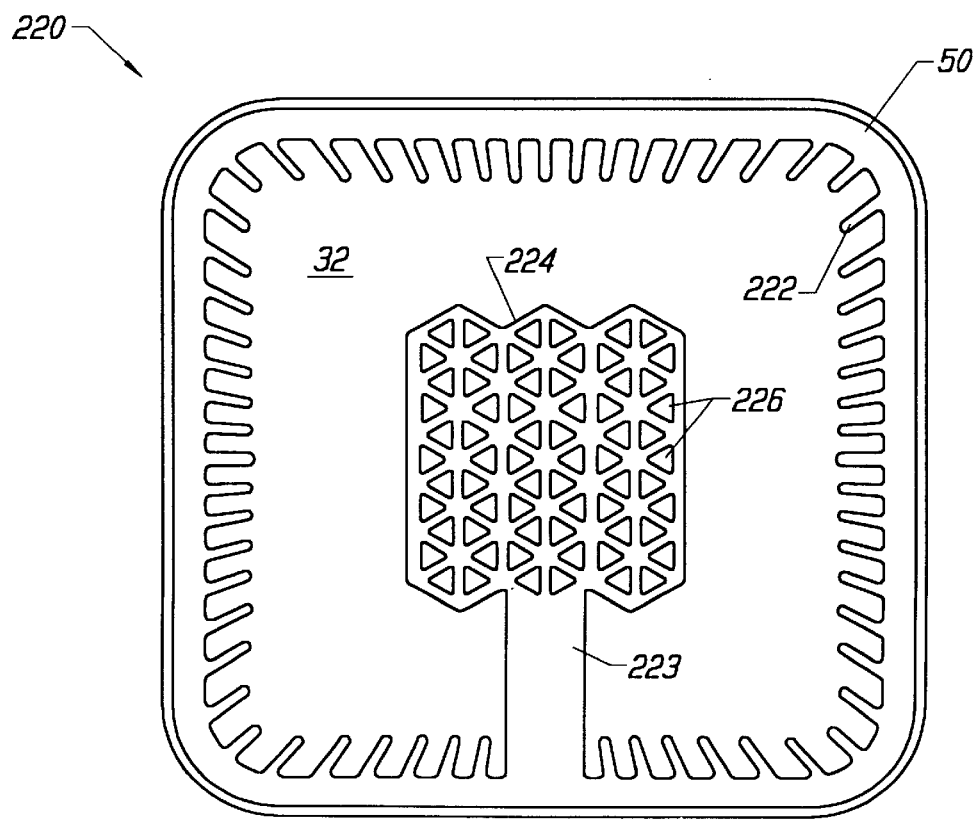
FIG. 34 is an alternate embodiment of the invention which includes an evaporator plateau with triangular condenser regions formed therein.

FIG. 34 illustrates another heat spreader 220 in accordance with the invention. The heat spreader 220 includes a non-capillary region 32 surrounded by a capillary fluid path 50. The capillary fluid path 50 includes extended surface elements 222. The capillary fluid path 50 leads to a capillary fluid path bridge 223, which terminates in an evaporator plateau 224. The evaporator plateau 224 has a set of non-capillary regions 226. In this embodiment, each non-capillary region 226 is in the form of a triangle. FIG. 34 illustrates that different implementations of the disclosed invention may be combined to construct an optimal device for a particular application.

Figure 35:
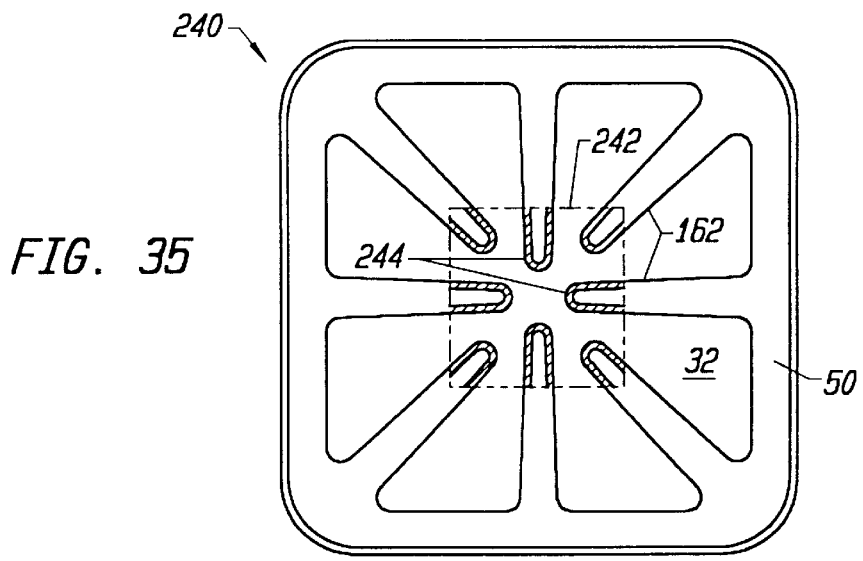
FIG. 35 is a plan view of an embodiment of the invention which includes perimeter nucleation site surfaces in selected regions of the capillary fluid path.

FIG. 35 is a plan view of another embodiment of the invention. The device 240 of FIG. 35 generally corresponds to the device 160 of FIG. 17. However, in FIG. 35, the edges 244 of the capillary fluid path 50 in a heat generating region 242 are treated to become nucleation surfaces. In other words, the nucleation edges 244 have been treated to promote boiling. The nucleation surface is generally a roughened surface. The surface may be formed by sandblasting, laser etching or other technique that leaves a rough surface or a surface with small pockets in it.

Figure 36:
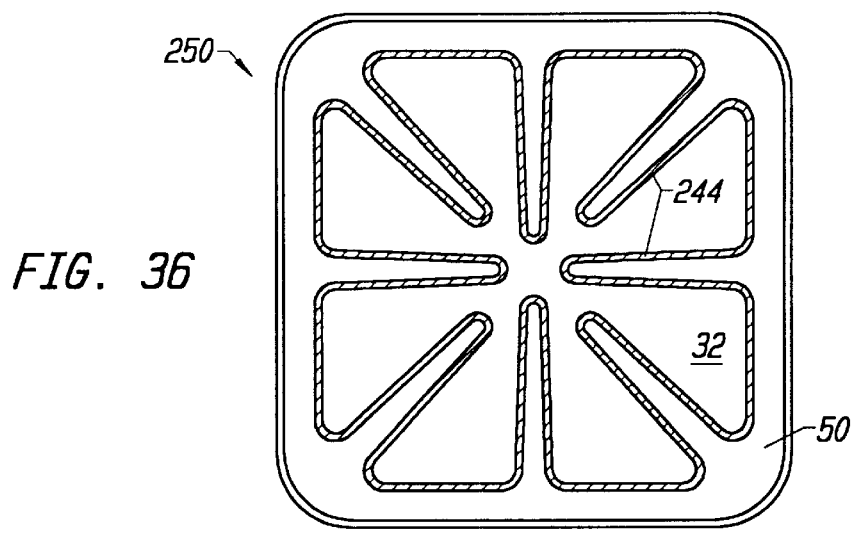
FIG. 36 is a plan view of an embodiment of the invention which includes perimeter nucleation site surfaces throughout the capillary fluid path.
Figure 37:
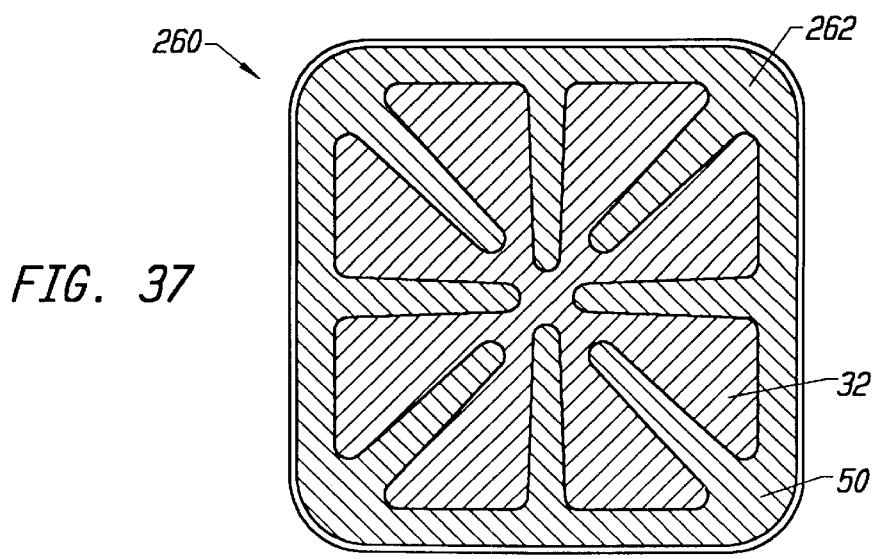
FIG. 37 is a plan view of an embodiment of the invention which includes nucleation site surfaces over capillary regions and non-capillary regions.

FIG. 36 illustrates a device 250 with nucleation edges along all of the capillary fluid path surfaces 50. The device 260 of FIG. 37 illustrates that both the non-capillary region 32 and the entire fluid capillary path 50 may be formed with a nucleation surface 262. This embodiment is used for ease of manufacturing. A problem with this embodiment is that some nucleation surfaces may cause resistance in the fluid capillary path 50.

Figure 38:
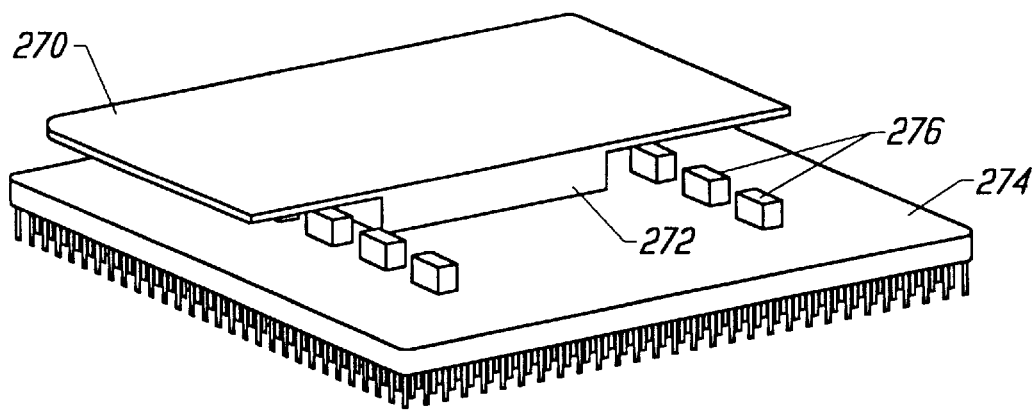
FIG. 38 is a perspective view of an embodiment of the invention with a pedestal member used to provide clearance over capacitors formed on the top of a semiconductor package.

FIG. 38 is a perspective view of another embodiment of the invention. The device 270 of FIG. 38 has a pedestal 272 so that the remaining portion of the heat spreader 270 clears any objects adjacent to a heat generating surface. For example, the semiconductor package 274 includes a set of on-board capacitors 276. Thus, the pedestal 272 is used to clear the on-board capacitors 276. Preferably, the pedestal 272 is integrally formed with the remaining portion of the device 270. The pedestal 272 may be solid metal.

Figure 39:
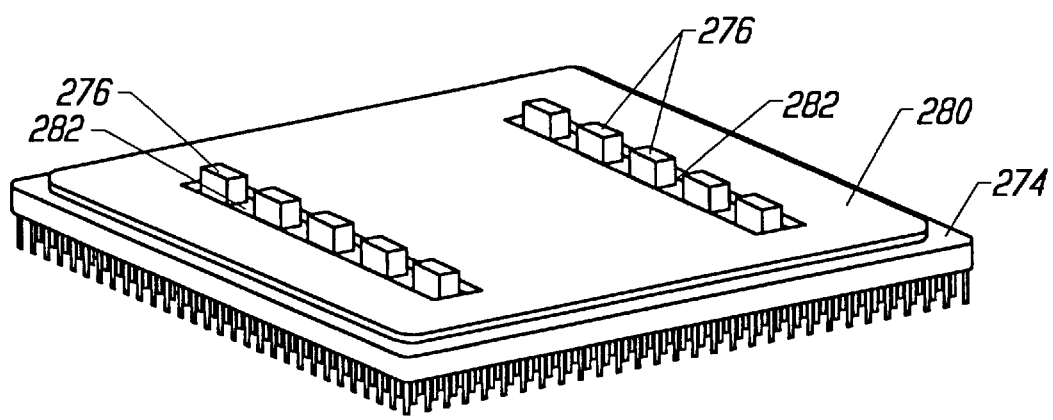
FIG. 39 is a perspective view of an embodiment of the invention with apertures to provide clearance for capacitors formed on the top of a semiconductor package.

FIG. 39 is a perspective view of another embodiment of the invention. In this embodiment the heat spreader 280 is punctured with apertures 282. The apertures 282 allow protruding devices, such as on-board capacitors 276 of the semiconductor package 274, to extend through the heat spreader 280.

Figure 40:
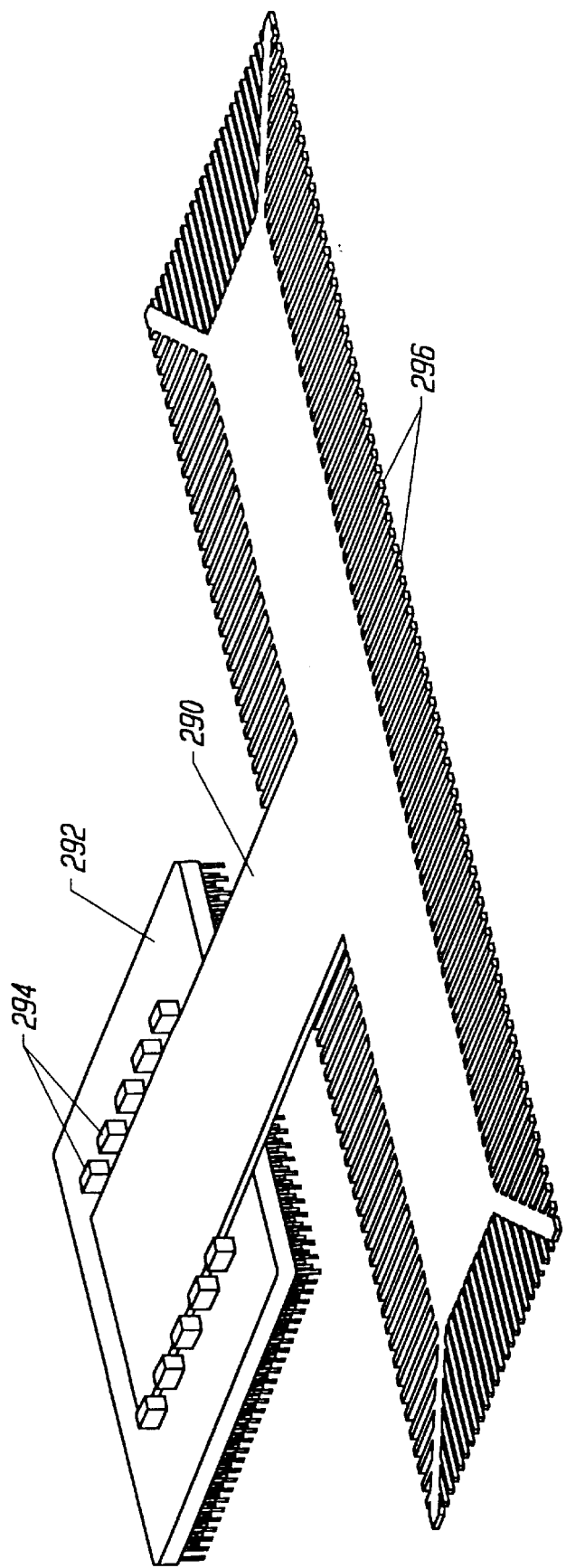
FIG. 40 is a perspective view of an embodiment of the invention wherein the apparatus includes an extended surface area and planar heat sink fins formed integrally within the plane defined by the apparatus.

FIG. 40 is a perspective view of a heat spreader 290 formed in accordance with another embodiment of the invention. The heat spreader 290 is positioned on semiconductor package 292, which includes on-board capacitors 294. The heat spreader 290 extends from the surface of the semiconductor package 292 into a cooling region. For example, if the semiconductor package 292 is positioned in a lap top computer, then the heat spreader 290 may extend beyond the semiconductor package 292 underneath the keyboard of the lap top computer. The interior portion of the heat spreader 290 includes a capillary fluid path and non-capillary regions as described above. The heat spreader 290 also includes heat fins 296. Preferably, the heat fins are not part of the interior portion of the heat spreader 290; that is, they do not have fluid circulating in them. Observe that the heat fins 296 are formed in the same plane as the heat spreader 290. This configuration is in contrast to prior art devices where the heat fins are orthogonal to the heat spreading surface.

Figure 41:
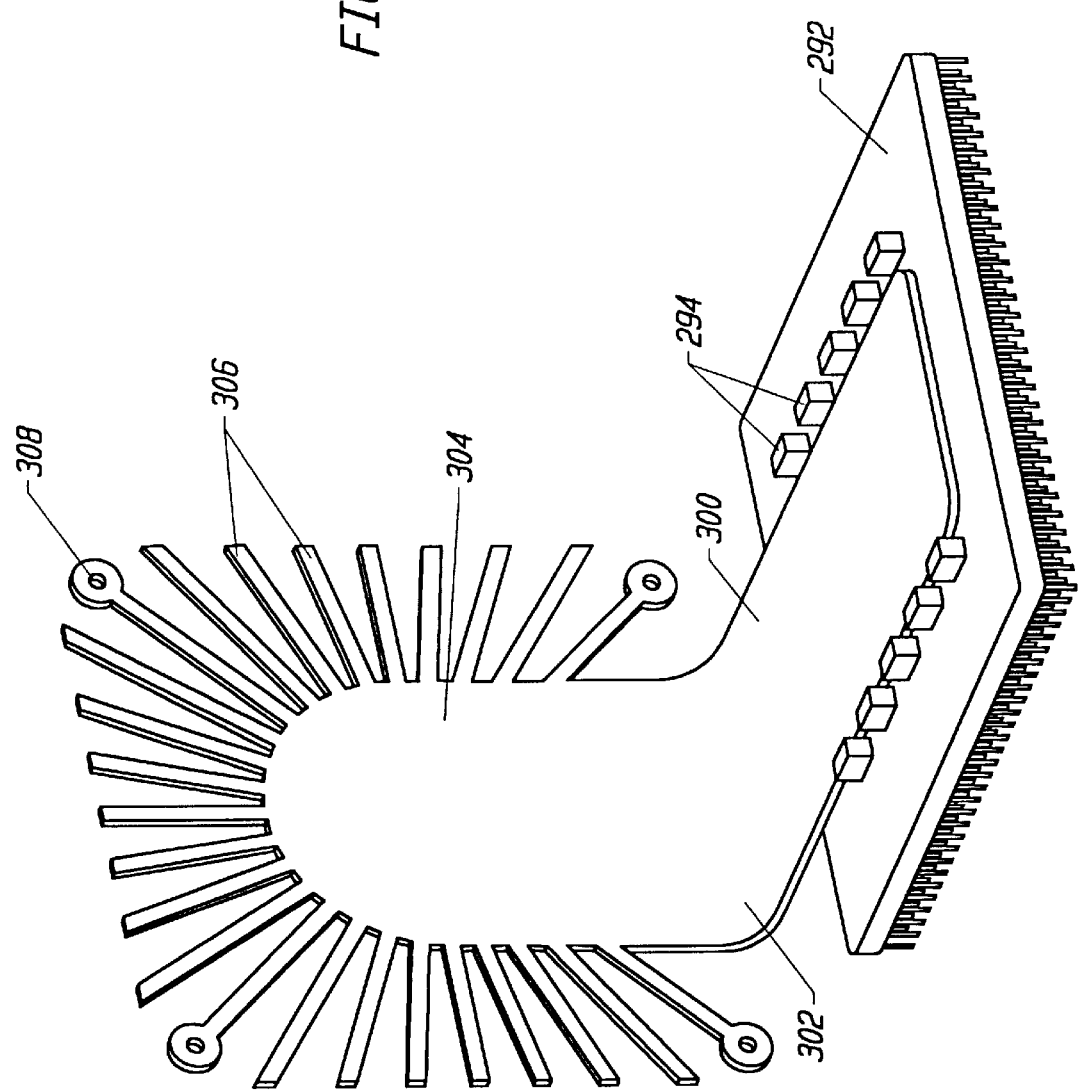
FIG. 41 is a perspective view of an embodiment of the invention wherein the apparatus includes a curved body and planar heat sink fins formed integrally within the plane defined by the apparatus.

FIG. 41 is a perspective view of a heat spreader 300 formed in accordance with another embodiment of the invention. As in the previous embodiment, the heat spreader 300 is positioned on a semiconductor package 292, which includes on-board capacitors 294. The heat spreader 300 includes a curved or bent region 302, which terminates in an orthogonal surface 304. Fluid circulates in capillary fluid path and non-capillary regions of the device 300. In particular, fluid continuously circulates from the horizontal region of the device 300, through the bend 302, and through the orthogonal surface 304. The device 300 also includes heat fins 306. Selected heat fins 306 include apertures 308, which may be used to attach a fan (not shown) to the orthogonal surface 304.

Observe that in each embodiment of the invention, the planar capillary fluid path is a continuous surface. That is, it is continuous in the sense that the fluid can move over the entire surface. In other words, fluid can move from any region on the surface to any other region on the surface.

Another noteworthy aspect of the invention is that most embodiments result in a substantially square apparatus. As used herein, the term substantially square refers to a length-to-width ratio of approximately 20:1, more preferably of approximately 2:1, and most preferably of approximately 1:1. Most prior art heat pipes and thermosiphons are configured as tubes.

The invention is unique in that the capillary fluid movement is established by a planar capillary defined in two adjacent horizontal planes. In prior art heat pipes, capillary fluid movement is typically established through grooves formed in a surface. In other words, small vertical walls are formed in a horizontal surface to establish capillary fluid movement. Vertical surfaces are not used in the present invention to establish capillary fluid movement. Instead, capillary fluid movement is established by the top (ceiling) and bottom (floor) surfaces of the planar capillary path.

The following table compares the heat spreading ability of various solid materials with that of the embodiment of the invention shown in FIG. 17.

TABLE I

| Material Performance | Weight (Grams) | Thermal Conductivity (W/m/K) | Thermal Resistance (° c./W) | Factor |
|---|---|---|---|---|
| Copper/ Tungsten (13/87) | 81.0 | 210 | 0.882 | 1.0 |
| Molybdenum (99.9%) | 50.5 | 146 | 1.268 | 0.70 |
| Aluminum 6061 | 13.4 | 180 | 1.028 | 0.86 |
| Gold (99.9%) | 95.2 | 317 | 0.584 | 1.51 |
| Copper (OFHC) | 44.1 | 391 | 0.473 | 1.86 |
| Silver (99.9%) | 51.8 | 429 | 0.432 | 2.04 |
| Diamond (Iia) | 17.4 | 1,850 | 0.100 | 8.82 |
| Invention | 39.8 | p4,512 | 0.041 | 21.51 |

The performance factor is normalized with respect to copper/tungsten. All heat spreaders measure 71.0 mm×71.0 mm×1.0 mm. All heat spreaders had a 19.0 mm×19.0 mm square heat source centered on one side, and a 7.0 mm wide finned heat sink around the perimeter of the opposing side. The invention was implemented with molybdenum and included a non-capillary region with a depth of 0.375 mm and a capillary path with a depth of 0.125 mm. The device was charged with 0.329 cc of water at a pressure of 14 millibars at 25° C. Better performance results are realized with a more rigorous charging procedure. In general, the apparatus of the invention should be charged to an overfill condition of approximately 20%. That is, the liquid that does not fit in the fluid capillary path when the fluid capillary path is filled should constitute approximately 20% of the total liquid within the device. In general, the invention is implemented by using 0.007 cc of fluid per $cm^2$ of surface area of the device.

The outstanding thermal conductivity characteristics of the apparatus of the invention allows the invention to be implemented in a variety of materials. In other words, since a large percentage of the thermal conductivity performance is attributable to the heat of vaporization, the particular material used to implement the invention is not crucial from a thermal conductivity standpoint. Instead, the material may be selected on the basis of cost, coefficient of thermal expansion, or other factors. One low cost implementation of the invention is in plastic, provided a hermetic seal is supplied.

The fluid within the planar capillary fluid path moves very quickly during steady state operation. Typically, the fluid moves at a speed of between 25 and 200 mm/s. This speed is dramatically faster than any device that uses a wick. This characteristic of the invention is partly responsible for the outstanding thermal distribution performance.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A heat spreading apparatus, comprising:
    a first planar body for attachment to a heat generating surface which produces a hot region and a cool region on said first planar body;
    a second planar body connected to said first planar body to define a void between said first planar body and said second planar body, said void including a non-capillary region with a first vertical height to facilitate vapor transport and a planar capillary region with a second vertical height, less than said first vertical height to facilitate capillary fluid motion, said planar capillary region having a substantially rectangular cross-section; and
    a fluid positioned within said void for distributing heat by vaporizing said fluid from said planar capillary region in said hot region, condensing said fluid in said non-capillary region in said cool region, and moving from said non-capillary region to said planar capillary region in said hot region through capillarity.

2. The apparatus of claim 1 wherein said planar capillary region is defined by a bottom planar capillary surface and a corresponding top planar capillary surface, said bottom planar capillary surface being vertically positioned with respect to said top planar capillary surface to produce said capillarity.

3. The apparatus of claim 2 wherein the vertical distance between said bottom planar capillary surface and said top planar capillary surface is less than 0.5 mm.

4. The apparatus of claim 2 wherein said bottom planar capillary surface is a continuous surface allowing said fluid to travel to any position on said continuous surface and said top planar capillary surface is an aligned continuous surface.

5. The apparatus of claim 1 wherein said first planar body and said second planar body are each in a substantially square configuration.

6. The apparatus of claim 1 further comprising a heat removal device attached to said second planar body, said heat removal device being selected from the group including a finned heat sink and a fan.

7. The apparatus of claim 1 wherein said first planar body and said second planar body have a combined vertical height of less than 1.5 mm.

8. The apparatus of claim 1 wherein said first planar body forms a floor of said void and said second planar body forms a ceiling of said void, the vertical distance between said ceiling and said floor at said non-capillary region is less than 1.0 mm.

9. The apparatus of claim 1 wherein the amount of fluid within said void is approximately 0.007 cc per $cm^2$ of surface area of said apparatus.

10. The apparatus of claim 1 wherein said non-capillary region is configured to include a center region with planar capillary regions extending therefrom in a radial configuration.

11. The apparatus of claim 1 wherein said non-capillary region includes a plurality of non-capillary regions each shaped in a predetermined pattern that is surrounded by said planar capillary region.

12. The apparatus of 11 wherein said plurality of non-capillary regions have varying sizes.

13. The apparatus of claim 11 wherein said predetermined pattern is a square.

14. The apparatus of claim 11 wherein said predetermined pattern is a circle.

15. The apparatus of claim 11 wherein said predetermined pattern is a triangle.

16. The apparatus of claim 1 wherein said planar capillary region is bound by a perimeter surface, a fluid path bridge, and an evaporator plateau.

17. The apparatus of claim 16 wherein said evaporator plateau includes a plurality of non-capillary regions each shaped in a predetermined pattern.

18. The apparatus of claim 1 wherein said planar capillary region is bound by extended surface elements.

19. The apparatus of claim 1 wherein only one surfaces previusly recited of said void include nucleation sites.

20. The apparatus of claim 19 wherein said nucleation sites are positioned only on the perimeter of a planar capillary path bounding said planar capillary region.

21. The apparatus of claim 20 wherein said nucleation sites are positioned only on the perimeter of a planar capillary path bounding said planar capillary region, said planar capillary path positionally corresponding to said heat generating surface.

22. The apparatus of claim 1 wherein said first planar body includes a pedestal to vertically lift a portion of said first planar body above said heat generating surface.

23. The apparatus of claim 1 wherein said first planar body and said second planar body include apertures to accommodate surface protrusions on said heat generating, surface.

24. The apparatus of claim 1 further comprising, heat dissipation fins formed in the plane defined by said first planar body and said second planar body.

25. The apparatus of claim 1 wherein said first planar body and said second planar body include a curved region.

26. The apparatus of claim 25 wherein said curved region causes said first planar body and said second planar body to exist in both a horizontal plane and a vertical plane.

27. A heat spreading apparatus, comprising:

a first body portion; and a second body portion connected to said first body portion to define a void between said first body portion and said second body portion, said void including a planar capillary region with a substantially rectangular cross-section defined by said first planar body and said second planar body, said planar capillary region adapted to transport a condensed fluid from a cool region of said void to a hot region of said void where said fluid is evaporated.

28. The apparatus of claim 27 wherein said planar capillary region is defined by a bottom planar capillary surface and a corresponding top planar capillary surface, said bottom planar capillary surface being vertically positioned with respect to said top planar capillary surface such that said condensed fluid is transported from said cool region to said hot region by capillarity.

29. The apparatus of claim 28 wherein the vertical distance between said bottom planar capillary surface and said top planar capillary surface is less than 0.5 mm.

30. The apparatus of claim 28 wherein said bottom planar capillary surface is a continuous surface allowing said fluid to travel to any position on said continuous surface and said top planar capillary surface is an aligned continuous surface.

31. The apparatus of claim 27 wherein said first body portion and said second body portion have a combined vertical height of less than 1.5 mm.

32. The apparatus of claim 27 wherein said first body portion forms a floor of said void and said second body portion forms a ceiling of said void, the vertical distance between said ceiling and said floor being less than 1.0 mm.

33. The apparatus of claim 27 further comprising a non-capillary region formed within said void, said non-capillary region being configured to include a center region with planar capillary regions extending therefrom in a radial configuration.

34. The apparatus of claim 27 wherein said surfaces of said void include nucleation sites.

\* \* \* \* \*